United States Patent [19]

Vail, III et al.

[11] Patent Number: 4,792,757

[45] Date of Patent: * Dec. 20, 1988

[54] OIL WELL LOGGING TOOLS MEASURING PARAMAGNETIC LOGGING EFFECT FOR USE IN OPEN BOREHOLES AND CASED WELL BORES

[75] Inventors: William B. Vail, III, Bothell; Paul B. Schwinberg, Seattle, both of Wash.

[73] Assignee: ParaMagnetic Logging, Inc., Woodinville, Calif.

[*] Notice: The portion of the term of this patent subsequent to Apr. 7, 2004 has been disclaimed.

[21] Appl. No.: 35,084

[22] Filed: Apr. 6, 1987

Related U.S. Application Data

[63] Continuation of Ser. No. 720,943, Apr. 8, 1985, Pat. No. 4,656,422, and a continuation-in-part of Ser. No. 387,198, Jun. 10, 1982, Pat. No. 4,528,508.

[51] Int. Cl.$^4$ .............................................. G01R 33/20
[52] U.S. Cl. ..................................... 324/303; 324/301
[58] Field of Search ................ 324/300, 303, 301, 302

[56] References Cited

U.S. PATENT DOCUMENTS

| | | | |
|---|---|---|---|
| 3,019,383 | 1/1962 | Varian | 324/301 |
| 3,060,371 | 10/1962 | Townsend | 324/303 |
| 3,360,717 | 12/1967 | Bloom et al. | 324/303 |
| 3,395,337 | 7/1968 | Varian | 324/303 |
| 3,398,355 | 8/1968 | Barringer | 324/301 |
| 3,411,070 | 11/1968 | Anderson | 324/301 |
| 3,437,914 | 4/1969 | Barringer | 324/303 |
| 4,528,508 | 7/1985 | Vail III | 324/303 |
| 4,656,422 | 4/1987 | Vail III et al. | 324/303 |

Primary Examiner—Michael J. Tokar
Attorney, Agent, or Firm—Flehr, Hohbach, Test, Albritton & Herbert

[57] ABSTRACT

Nucleons which are chemically bound to oil and water in geological formations possess magnetic moments which align in the earth's magnetic field causing the natural nuclear paramagnetism of the formation. An A.C. magnetic field at the Larmor frequency is repetitively applied to the formation adjacent to a borehole resulting in a repetitive excitation-relaxation process of the nucleons present within an "excitation zone" which results in an amplitude modulation of the paramagnetism within this zone. This physical process results in an amplitude modulation of the earth's magnetic field in the vicinity of the excitation zone of the formation and is called the Paramagnetic Logging Effect (PLE). The PLE may be measured with logging tools in open holes and within cased well bores. The PLE measures the following quantities within a predetermined excitation zone of the formation: amount of oil, amount of water, total fluid volume, the viscosity of oil present, oil saturation and water saturation factors, estimations of the permeability, positions of vertical oil and water boundaries adjacent to the borehole, and the locations of lateral discontinuities of the oil bearing formation. The PLE is sensitive to such parameters at least 10 feet laterally into formation and up to perhaps 100 feet radially away from the drill hole. A thorough theoretical description of the PLE in open holes and in the cased hole environment is presented along with the detailed engineering data necessary for the construction of practical tools.

4 Claims, 13 Drawing Sheets

OIL WELL LOGGING TOOLS MEASURING PARAMAGNETIC LOGGING EFFECT FOR USE IN OPEN BOREHOLES AND CASED WELL BORES

This application is a continuation of application Ser. No. 720,943 filed Apr. 8, 1985 now U.S. Pat. No. 4,656,422 and a continuation in part of application Ser. No. 387,198 filed June 10, 1982 and now U.S. Pat. No. 4,528,508.

This invention relates to the use of a new type of nuclear magnetic resonance method and apparatus which remotely senses and detects the presence of unknown petroleum reservoirs in geological formations and also allows the direct measurement of significant portions of the oil and water fluid volume contained within the reservoirs. The new method directly measures natural paramagnetism of the formation by measurement of a new physical "effect" called the Paramagnetic Logging Effect (PLE).

Nuclear paramagnetism was first measured at very low temperatures on solid hydrogen (G. B. Lasarew and L. W. Schubnikow, Phys. Z. Sowjet, 11, p. 445, 1937). In this experiment the sample's paramagnetism was observed during the temperature cycling. However, for ordinary sized laboratory samples at room temperature nuclear paramagnetism becomes extraordinarily feeble and difficult to measure. Consequently, many other experimental techniques known collectively as nuclear magnetic resonance techniques were developed to observe the nuclear magnetic moments of nucleons in solids and liquids.

Nuclear magnetic resonance measurements are classified into "continuous wave" and "pulse" methods. Continuous wave observations of nuclear magnetic resonance are performed using power absorption measurements or nuclear induction arrangements (E. R. Andrew, *Nuclear Magnetic Resonance*, Cambridge Univ. Press, N.Y., p. 34, 1955). Pulse methods, also known as free precession techniques, have been developed in recent years (T. C. Farrar and E. D. Becker, *Pulse and Fourier Transform NMR*, Academic Press, N.Y., p. 1, 1971).

Commnn to all these nuclear magnetic resonance techniques are various means used to apply an A.C. magnetic field at the Larmor frequency to the collection of magnetic moments in a sample. All of these techniques rely on initially producing a coherent magnetization of the sample which moves dynamically in time and which eventually decays due to relaxation phenomena. This initially coherent magnetization executes complex motion away from the axis of the original static magnetic field. Furthermore, this type of time varying coherent magnetization produces large observable effects in a laboratory environment such as the production of large A.C voltages in pick-up coils. Independent of the detailed experimental method used, the frequency of the induced A.C. voltage generated is normally at the precession frequency, or Larmor frequency, of the magnetization appropriate for the ambient static magnetic field present. The measurement of the presence of this coherent magnetization is, of course, an indication that the sample; is in the condition of resonance.

It is well known that a single nuclear magnetic moment executes a precessional motion around a static magnetic field. Here the nuclear magnetic moment may be due to a single proton within an atomic nucleus which is also called an "unpaired" proton or is the actual vector sum of the nuclear magnetic moments of the protons, neutrons, and other particles which comprise the atomic nucleus, hereafter referred to collectively as nucleons. For the discussions of the motions of such particles in applied A.C. magnetic fields, these several terms may be used interchangeably. In the normal 0.5 gauss earth's magnetic field, the proton's magnetic moment precesses at a Larmor frequency of approximately 2.1 kilohertz. The tip of the magnetic moment vector traces out a cone-shaped motion around the static magnetic field. If a large number of magnetic moments are placed in the earth's magnetic field, similar motion ensues except that the tips of the magnetic vectors fan out around the same cone. The fact that some of the nuclear magnetic moments have net components along the direction of the magnetic field causes the sample's paramagnetism.

A microscopic description of the fluids in formation provides the reason why these fluids exhibit the phenomenon of paramagnetism. Nucleons which are chemically bound in hydrocarbons and water possess magnetic moments. These moments tend to line up in the earth's magnetic field. Consequently, the earth's magnetic field in the vicinity of the hydrocarbons and water in formation is increased by their presence. This alteration of the strength of the magnetic field of the earth in the vicinity of fluids in formation is the phenomenon of paramagnetism. Conversely, if this alignment of nucleons in the earth's magnetic field is caused to disappear by any mechanism, then the paramagnetism of the formation would also disappear.

Heretofore, it has been noticed theoretically that as the conditions for nuclear magnetic resonance are reached, the original paramagnetism of the sample is reduced or eliminated (T. .C. Farrar and E. D. Becker, op. cit., p. 14). However, this fact has not been used experimentally to actually measure whether the sample has attained the conditions of resonance. Consequently, a new nuclear magnetic resonance method is proposed whereby the condition of resonance is measured by the reduction or disappearance of the original paramagnetism of the sample. Furthermore, it is proposed to use this new type of nuclear magnetic resonance method to detect the presence of unknown petroleum reservoirs in geological formations and also allow the direct measurement of significant portions of the oil and water fluid volume contained within the reservoirs. It is to be emphasized that the current practicality of the method is directly attributed to the enormous volume of liquid contained in a petroleum reservoir.

There have been prior attempts to utilize standard nuclear magnetic resonance techniques in situ and on entire bulk petroleum reservoirs.

In U.S. Pat. No. 3,019,383 (1962), Russell H. Varian proposes using a pulse type free precession nuclear magnetic resonance technique to indicate the presence of oil. In U.S. Pat. No. 3,060,371, Jonathan Townsend (1962) proposes performing resonance experiments on unpaired electronic moments to locate petroleum reservoirs.

In U.S. Pat. No. 3,398,355, a pulse type nuclear magnetic resonance experiment is proposed to be flown in aircraft to locate oil deposits. All of these methods rely on the coherent precession of magnetization after conditions appropriate for resonance have been obtained. Furthermore, all of these methods require relatively large magnetic fields and are consequently impractical.

Other techniques have been proposed to remotely sense bulk oil deposits by monitoring the absorption of radiation at the Larmor frequency. Examples of these methods are given in U.S. Pat No. 3,411,070 (1968) and in U.S. Pat. No. 3,437,914 (1969). Here again numerous theoretical and experimental flaws make these methods impractical.

Standard nuclear magnetic resonance methods are currently being used to measure the properties of oil reservoirs immediately adjacent to boreholes. See for examples U.S. Pat. Nos. 4,035,718 (1977); 3,667,035 (1972); 3,657,730 (1972); 3,617,867 (1971); 3,508,438 (1970); 3,483,465 (1969); 3,439,260 (1969); 3,395,337 (1968); etc. These methods are collectively described as polarization-precession methods. Normally a strong magnetic field is applied to the oil bearing formation which polarizes the nuclear moments present into a coherent magnetization. The strong magnetic field is then turned off rapidly. Consequently, the freely precessing nuclear moments in the earth's magnetic field are measured by sensing the A.C. voltage induced in an induction coil the Larmor frequency. Furthermore, in U.S. Pat. No. 3,360,717 (1967), A. L. Bloom proposes using the envelope of the A.C. signal from the freely precessing nuclear moments to measure the longitudinal relaxation times of the fluids present and hence distinguish oil and water based on these polarization-precession methods. The reason that these representative techniques are used immediately adjacent to boreholes is that the standard magnetic resonance methods used heretofore require applying relatively strong magnetic fields. Although these are useful measurements, they do not directly measure the amount of liquid petroleum available over large volumes of oil bearing formation.

The current state of the art of these polarization-precession logging tools is adequately described in an article entitled "An Improved Nuclear Magnetism Logging System and Its Application to Formation Evaluation" (R. C. Herrick, S. H. Couturie, and D. L. Best, 54th Annual Fall Technical Conference and Exhibition of the Society of Petroleum Engineers of the AIME, Las Vegas, Nev., Sept. 23-26, 1979). These logging tools are also called nuclear magnetism logging tools. These tools measure the fluid content in the formation immediately adjacent to a borehole to a lateral depth of only several borehole diameters. The measurement of the fluid saturation factors for oil and water present cannot be performed, however, if the transverse relaxation times of the constituents are very short. Furthermore, such fluid saturation measurements are critically dependent on the typically inaccurate estimations of the transverse relaxation times of the constituents. Additives to drilling mud are typically required to prevent the signal from the drilling mud to obscure the results. The tools also cause electrical transients because the polarizing fields are turned off rapidly and consequently prevent continuous measurements. Geometric irregularities of the borehole adversely affect measurements of the fluid saturation and can cause significant errors. Local gradients in the earth's magnetic field caused by objects such as borehole casing cause the failure of these tools. Magnetic formations also cause the failure of standard polarization-precession tools. These tools require large power sources to energize their polarization coils. Furthermore, these tools provide no information concerning the characteristic dimensions of the reservoir.

In fact, all properties such as the free fluid index, the longitudinal relaxation times of the fluids, viscosity, porosity, water saturation, oil saturation, and estimations of the permeability from these measurements only apply to regions immediately adjacent to the borehole which penetrate the formation only several borehole diameters.

Accordingly, an object of the invention is to provide a new and practical nuclear magnetic resonance method for the remote detection and direct volumetric measurement of petroleum reserves.

It is yet another object of the invention to provide new and practical nuclear magnetic resonance apparatus for the remote detection and the direct volumetric measurement of petroleum reservoirs.

And further, an object of the invention is to provide new and practical nuclear magnetic resonance methods and apparatus for the remote detection of the presence of unknown petroleum reservoirs in geological formations.

It is yet another object of the invention to provide new and practical nuclear magnetic resonance methods and apparatus which allow the direct volumetric measurement of significant portions of the oil and water fluid volumes contained within an oil bearing formation.

Furthermore, it is another object of the invention to provide new nuclear magnetic resonance methods and apparatus which measure the oil and water content of an oil bearing geological formation to a lateral distance of at least 1 feet and up to 1000 feet from the borehole.

Still further, it is yet another object of the invention to provide new nuclear magnetic resonance methods and apparatus for remote detection and volumetric measurement of petroleum reservoirs which contain chemical constituents with short relaxation times, particularly those with short transverse relaxation times.

It is yet another object of the invention to provide new nuclear magnetic resonance methods and apparatus which do not require any measurement of the transverse relaxation times of the oil and water species to allow computation of the fluid saturation factors for oil and water present.

Still further, it is yet another object of the invention to provide new nuclear magnetic resonance methods and apparatus which do not require that any chemical additives be added to the drilling mud to obtain accurate results.

Furthermore, it is yet another object of the invention to provide new nuclear magnetic resonance methods and apparatus which allow continuous measurements in time to be performed.

Still further, it is yet another object of the invention to provide new nuclear magnetic resonance methods and apparatus which allow measurements of the fluid saturation factors for oil and water even if the borehole has geometric irregularities.

Further, it is yet another object of the invention to provide a new nuclear magnetic resonance method and apparatus which may operate in the presence of large local magnetic field gradients such as those caused by borehole casing.

Still further, it is yet another object of the invention to provide new nuclear magnetic resonance methods and apparatus which operate in magnetic formations.

Furthermore, it is yet another object of the invention to provide new nuclear magnetic resonance methods and apparatus which consume little power and, in particular, methods and apparatus which do not require initially polarizing the oil bearing formation 5.

And further, it is still another object of the invention to provide new nuclear magnetic resonance methods and apparatus for the remote detection and volumetric measurement of petroleum reservoirs which also measure characteristic dimensions of the reservoirs.

And still further, it is another object of the invention to provide new nuclear magnetic resonance methods and apparatus which allow measurement of fluid parameters in the vicinity of an open borehole such as the free fluid index, the longitudinal relaxation times of the constituent fluids, the viscosity of oil, porosity, water saturation, oil saturation, and estimations of the permeability over distances which penetrate the oil bearing formation many borehole diameters.

And further, it is another object of the invention to provide new nuclear magnetic resonance methods and apparatus which allow measurement of fluid parameters in the vicinity of a cased borehole such as the free fluid index, the longitudinal relaxation times of the constituent fluids, the viscosity of oil, porosity, water saturation, oil saturation, and estimations of the permeability over distances which penetrate the oil bearing formation many borehole diameters.

Figure 3:
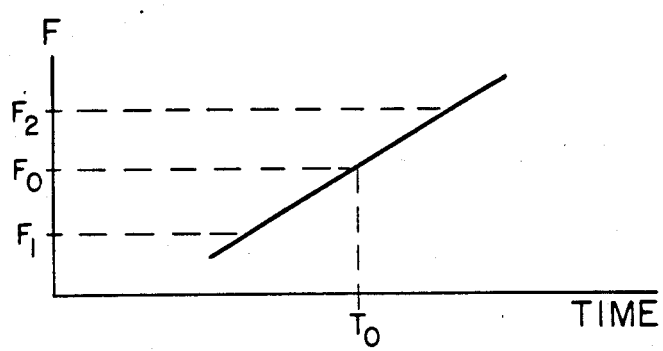

FIG. 3 describes frequency sweeping the A.C. magnetic field applied to the oil bearing formation.

Figure 4:
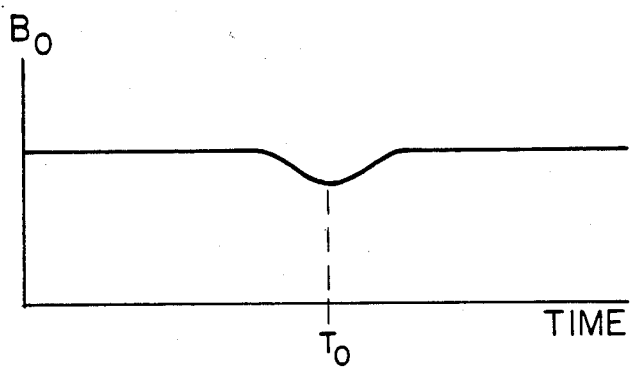

FIG. 4 shows the decrease in the magnetic field of the earth as the oil bearing formation is swept through nuclear magnetic resonance.

Figure 5:
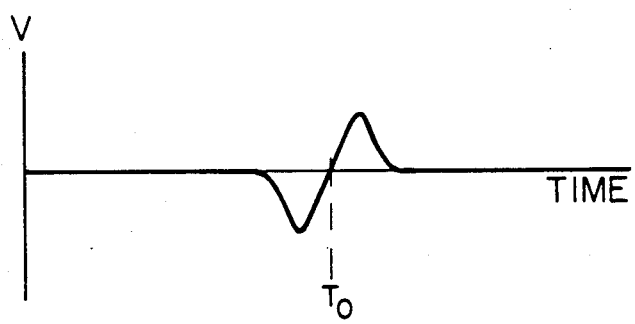

FIG. 5 shows the voltage induced in the induction coil magnetometer due to th variation in the earth's magnetic field as the oil bearing formation is swept through resonance.

Figure 6:
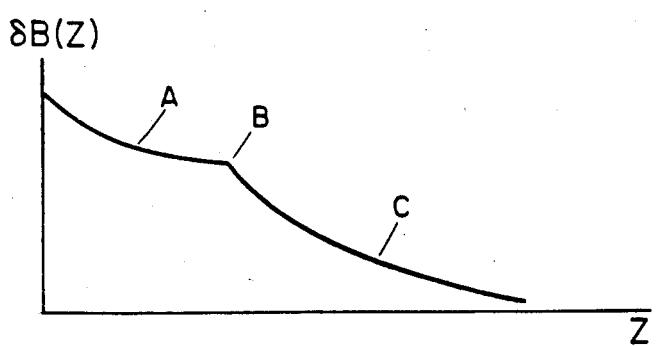
Figure 7:
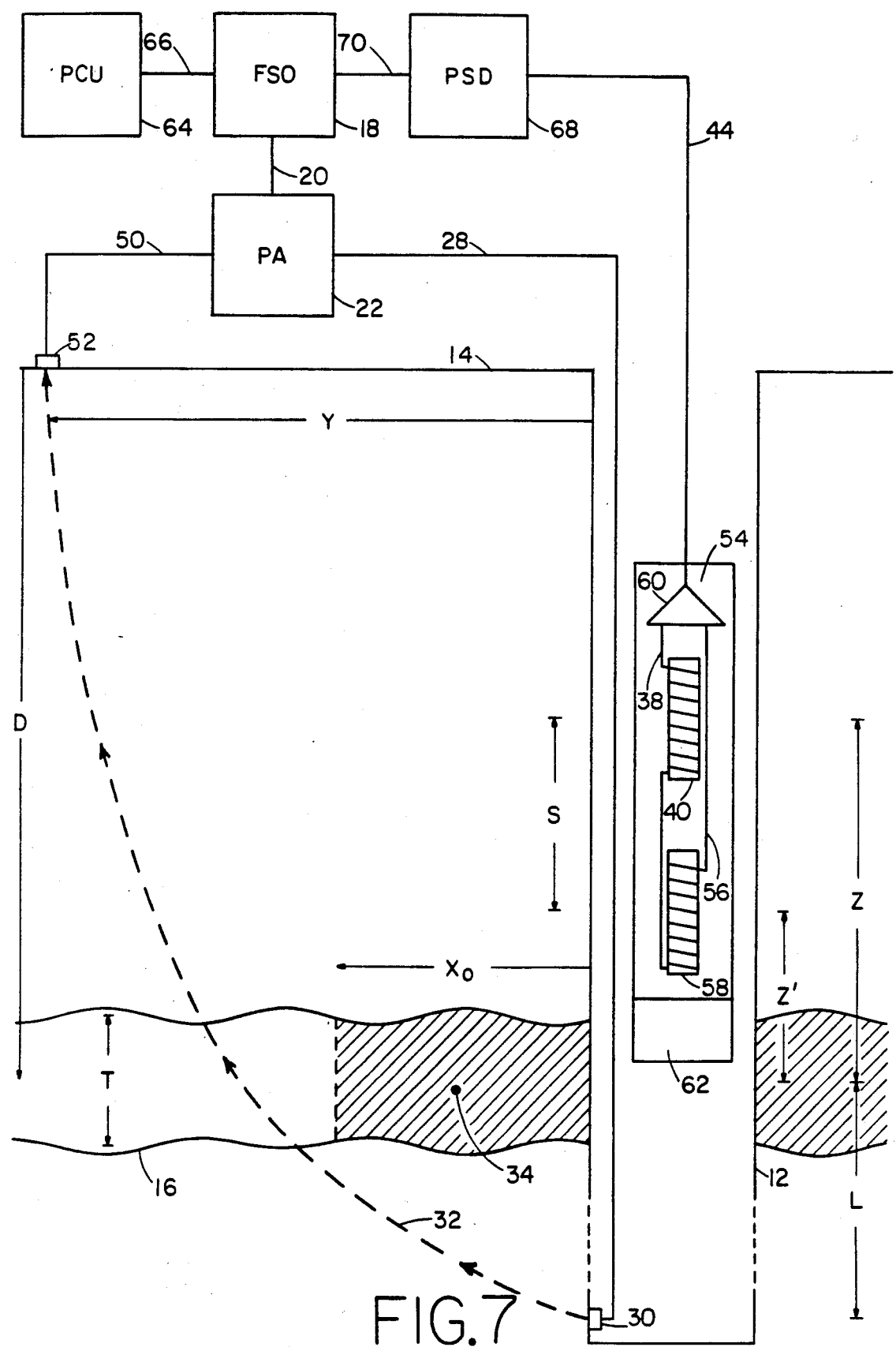

FIG. 6 describes the qualitative nature of the magnetic field variations for different distances above the oil bearing formation FIG. 7 is a sectional view of another preferred embodiment of the invention for remote detection and direct volumetric measurement of petroleum reservoirs appropriate for use in an open borehole.

Figure 8:
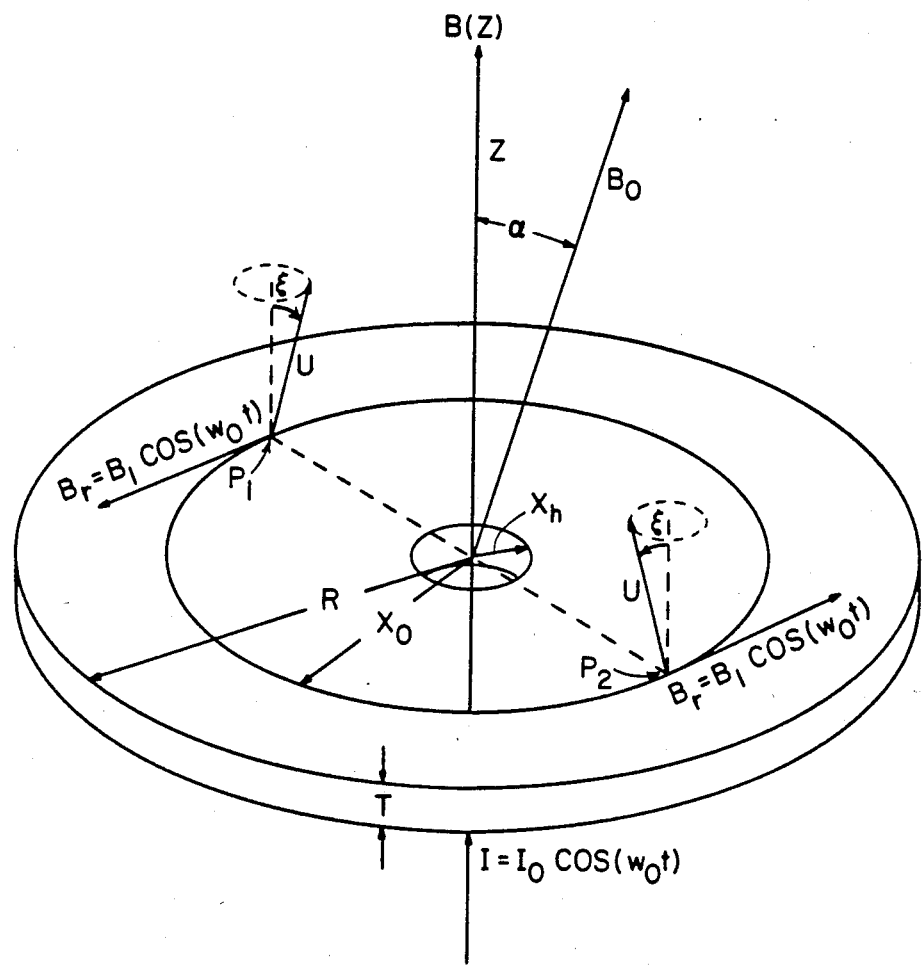

FIG. 8 is an illustrative diagram depicting the dynamics of the excitation process.

Figure 9:
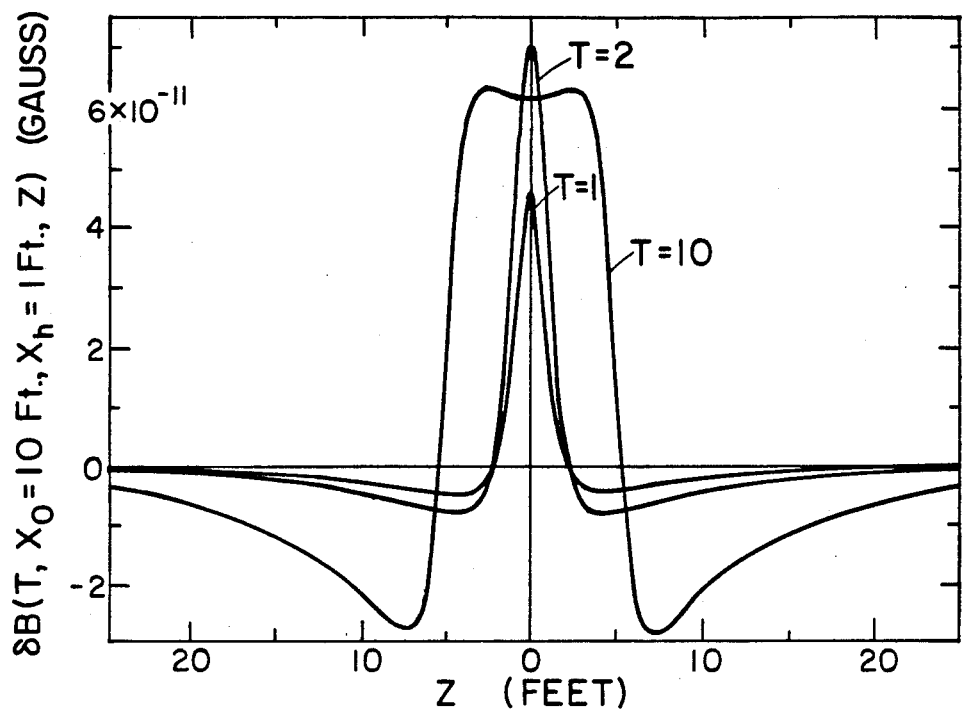

FIG. 9 is a vertical profile of the change in the earth's magnetic field on excitation $\delta B(T, X_0=10$ ft., $X_h=1$ ft., Z) calculated for various vertical positions Z where the excitation radius $X_0$ is held constant and equal to 10 feet (T=thickness).

Figure 10:
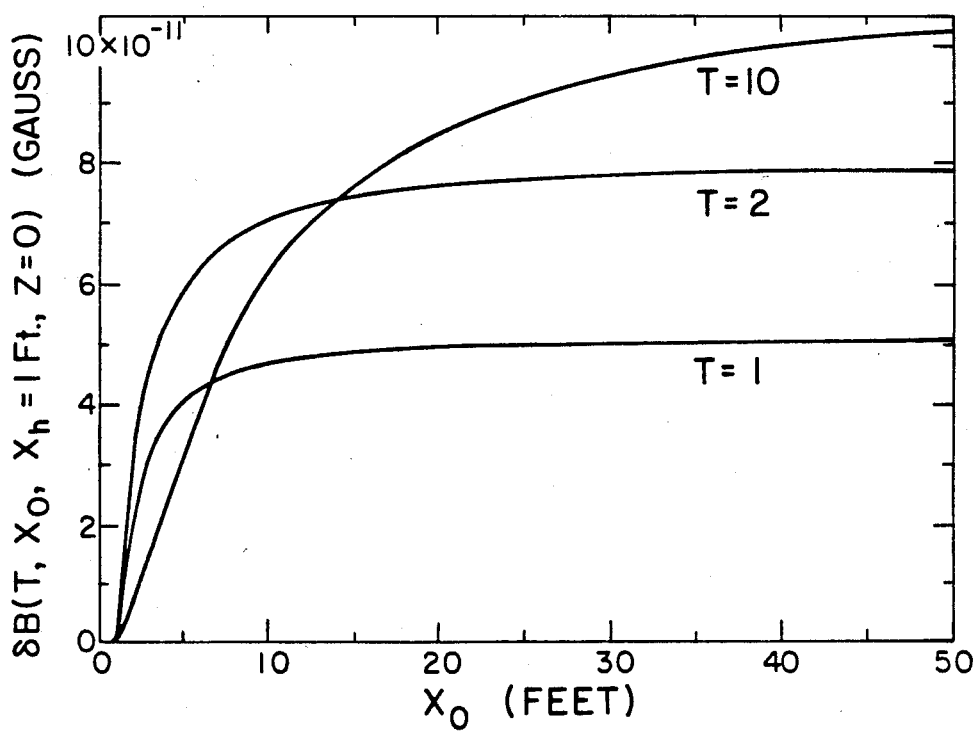

FIG. 10 shows the calculated change in the earth's magnetic field on excitation $\delta B(T, X_0, X_h=1$ ft., $Z=0)$ for various excitation radii $X_0$ where the measurements are performed in the vertical center of the formation.

Figure 11:
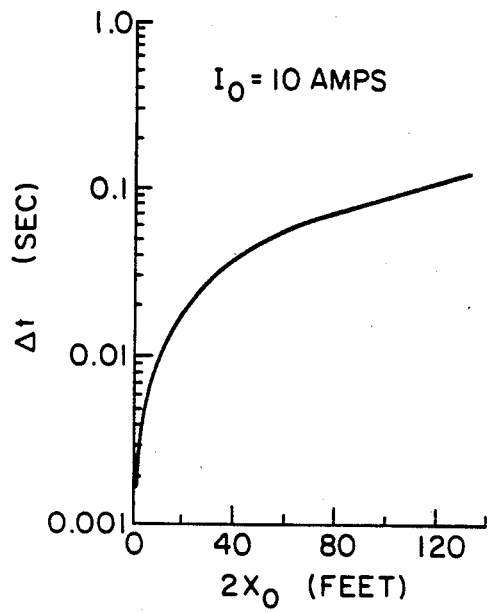

FIG. 11 shows the time required for excitation of the formation $\Delta t$ for different excitation diameters $(2 X_0)$ for a fixed magnitude excitation current of 10 amps peak-to-peak.

Figure 12:
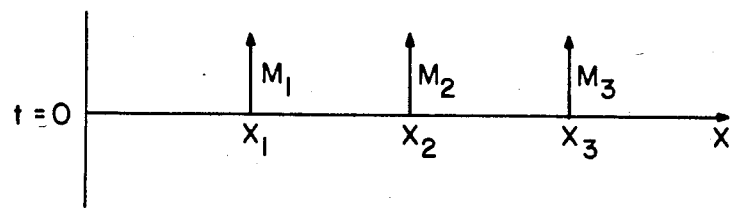
Figure 12:
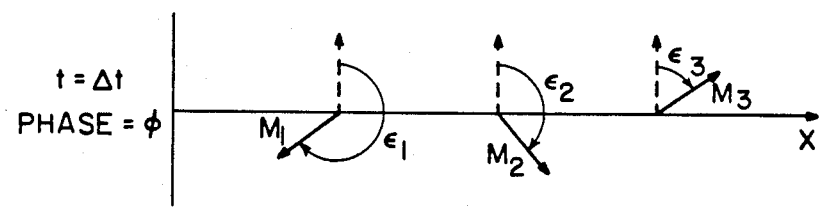
Figure 12:
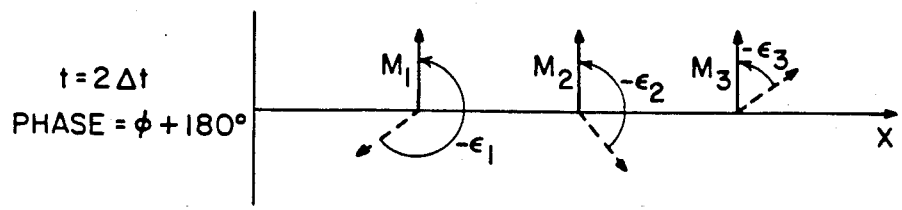

FIG. 12 is an illustrative diagram depicting the motion of magnetic moments during the excitation process for a phase modulation scheme.

Figure 13:
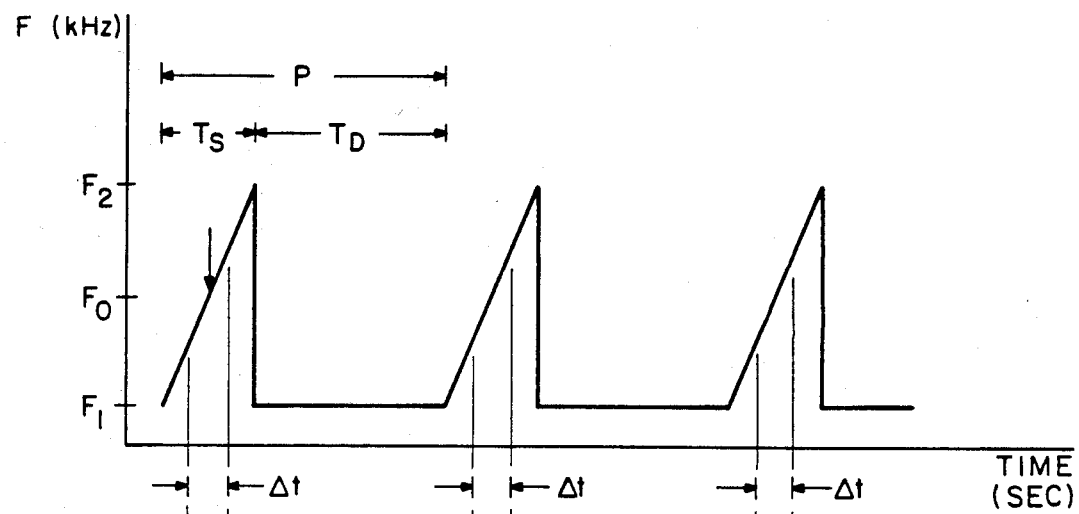

FIG. 13 shows repetitively sweeping the formation through nuclear magnetic resonance conditions with period P.

Figure 14:
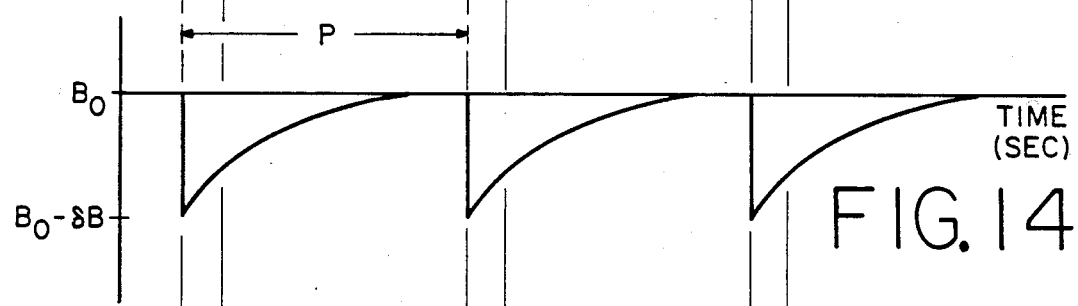

FIG. 14 shows the repetitive amplitude modulation of the earth's magnetic field caused by the repetitive sweeps through resonance with period P.

Figure 15:
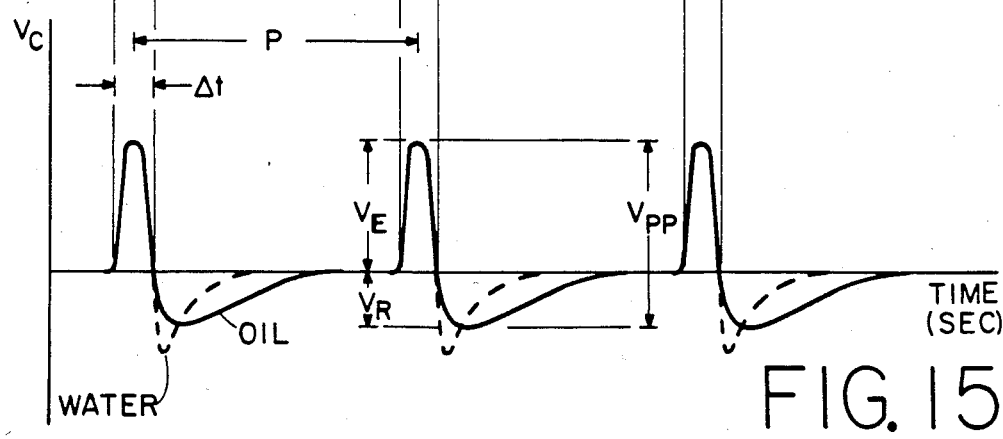

FIG. 15 shows the repetitive voltage waveform observed from an individual induction coil within the induction coil gradiometer as the formation is repetitively swept through the condition of nuclear magnetic resonance with period P.

Figure 16:
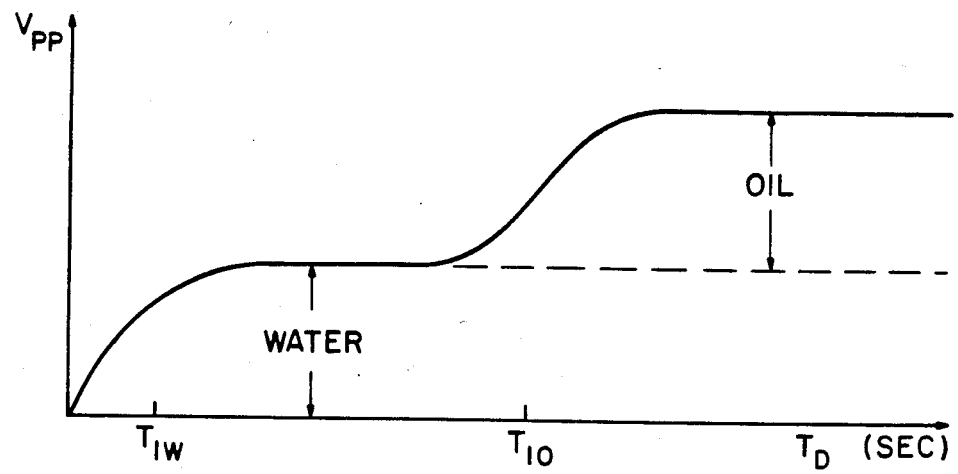

FIG. 16 depicts one graphical method used to separate the presence of oil and water.

Figure 17:
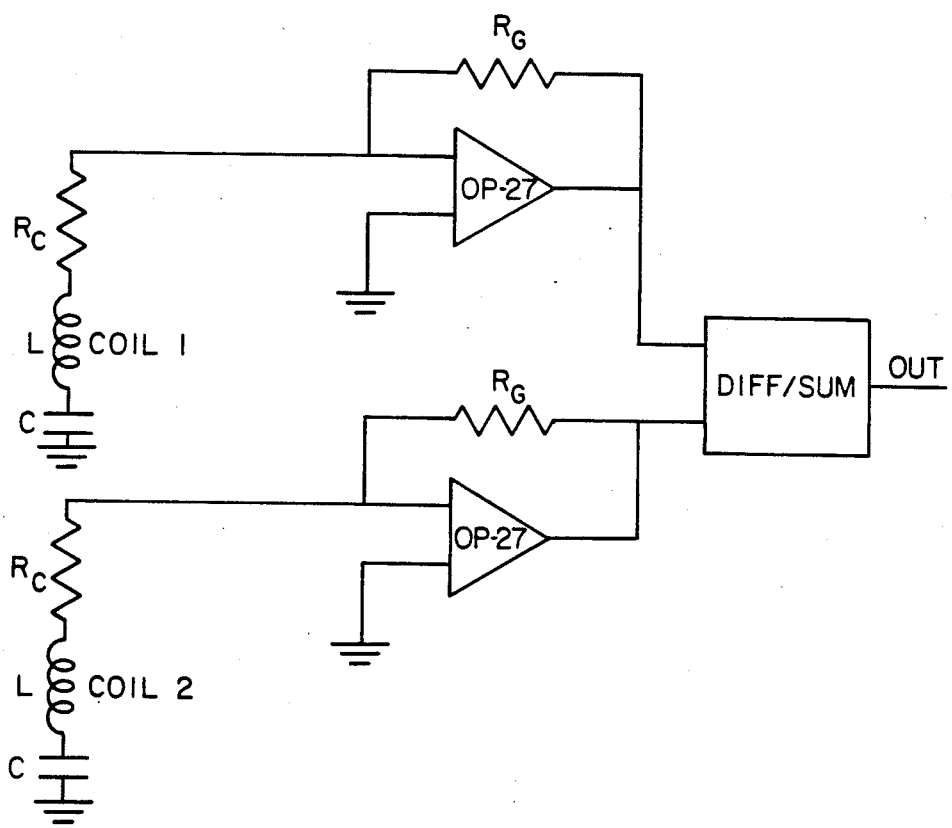

FIG. 17 presents an electronic circuit appropriate for use with an induction coil gradiometer.

Figure 18:
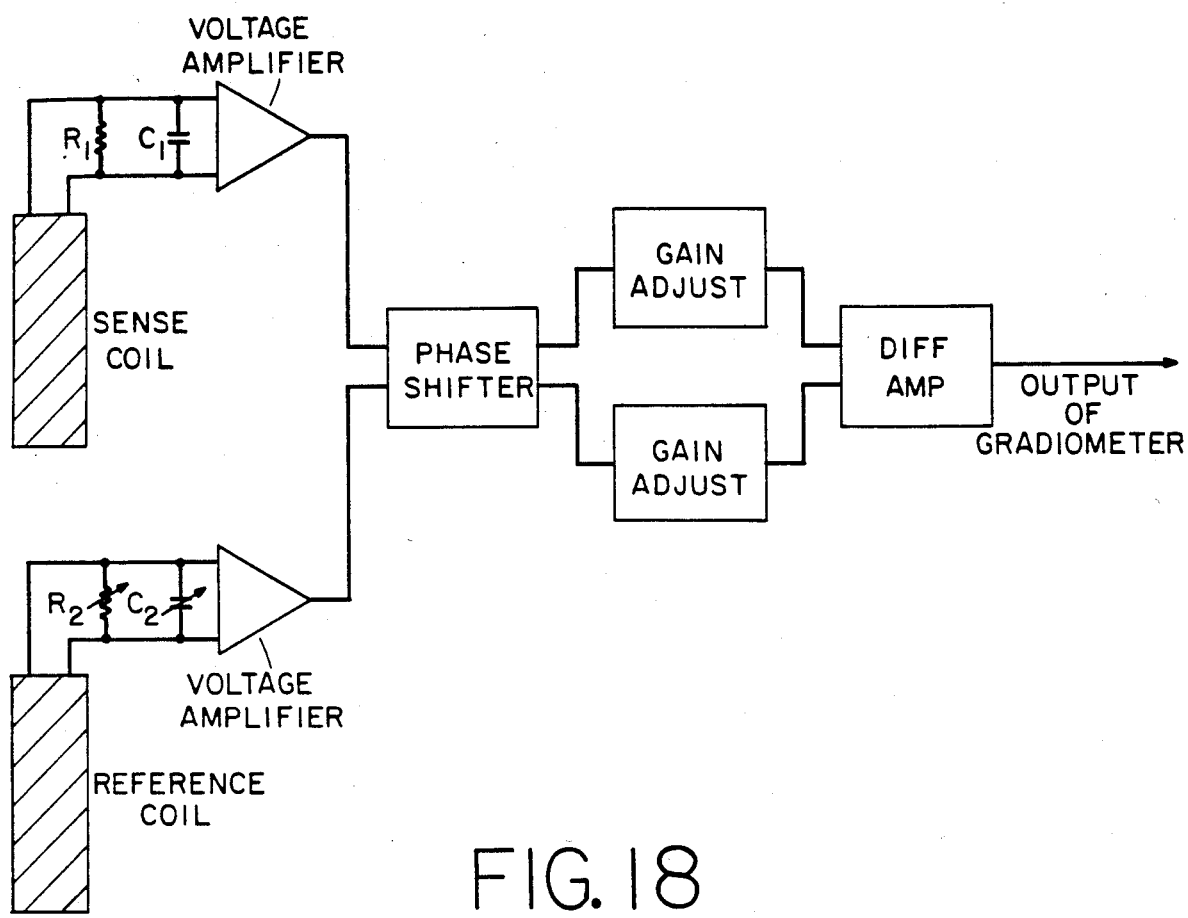

FIG. 18 shows a block diagram of a gradiometer which uses parallel resonated induction coils and voltage amplifiers to measure the PLE.

Figure 19:
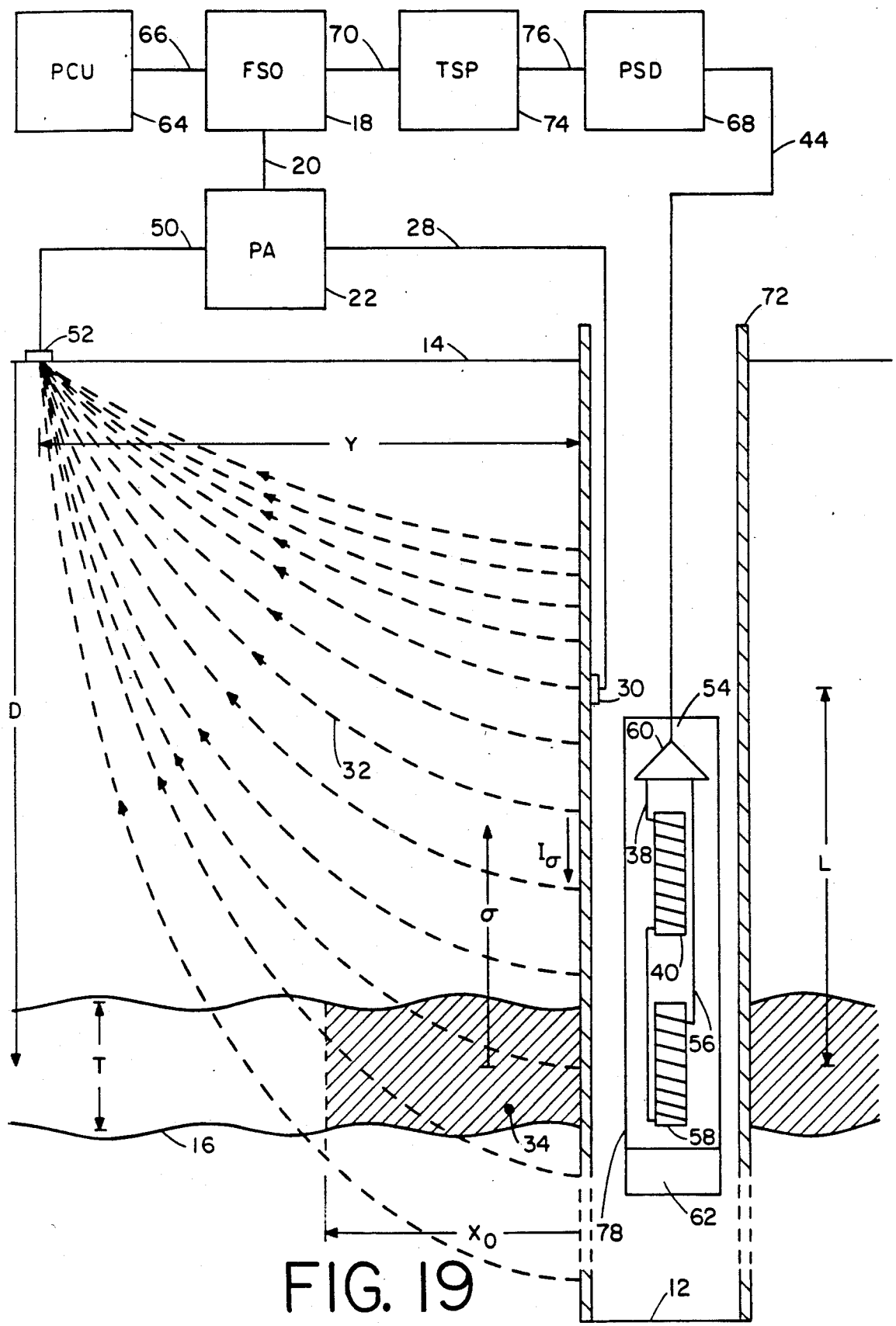

FIG. 19 is a sectional view of another preferred embodiment of the invention for use in cased boreholes.

Figure 20:
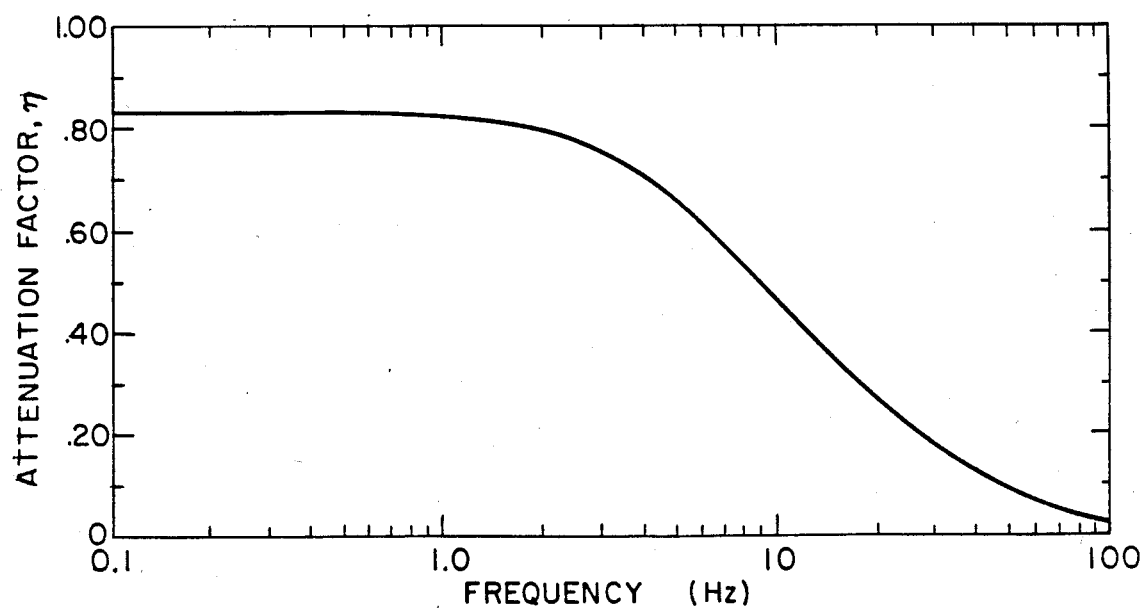

FIG. 20 is a plot of the attenuation factor vs. frequency for low frequency A.C. magnetic fields which are parallel to type P-110 borehole casing.

Figure 21:
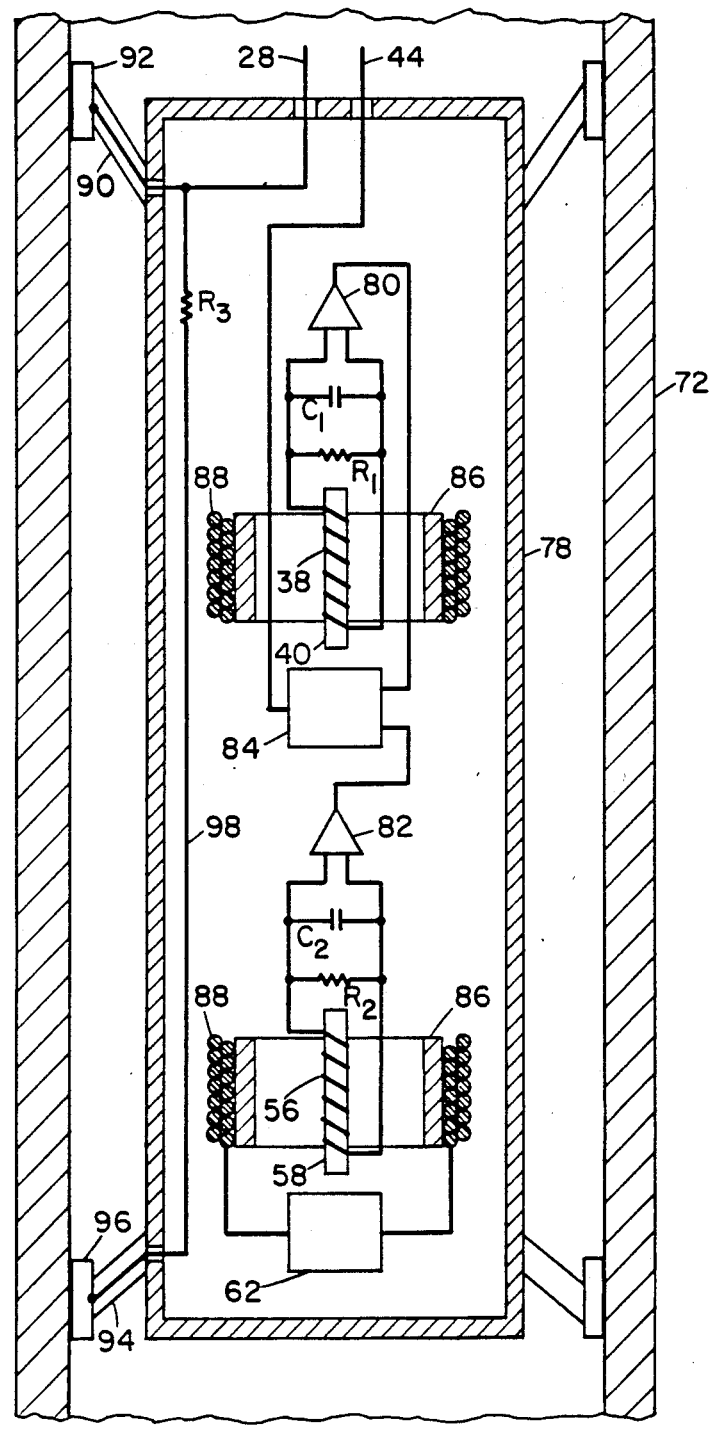

FIG. 21 shows one method for fabrication of a magnetic gradiometer to be used inside borehole casing.

Figure 22:
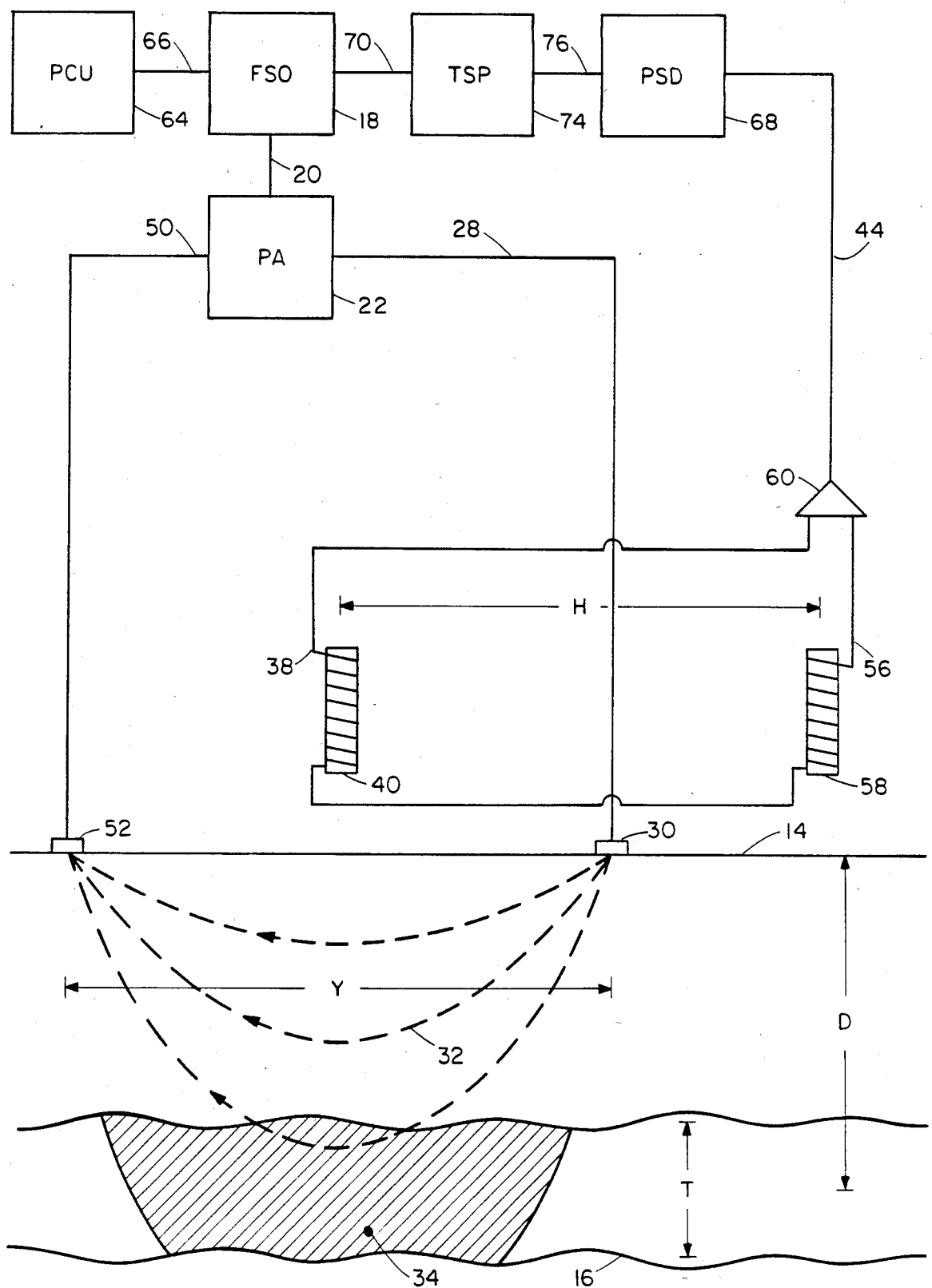

FIG. 22 is a sectional view of another preferred embodiment of the invention where no boreholes exist near the formation.

Figure 1:
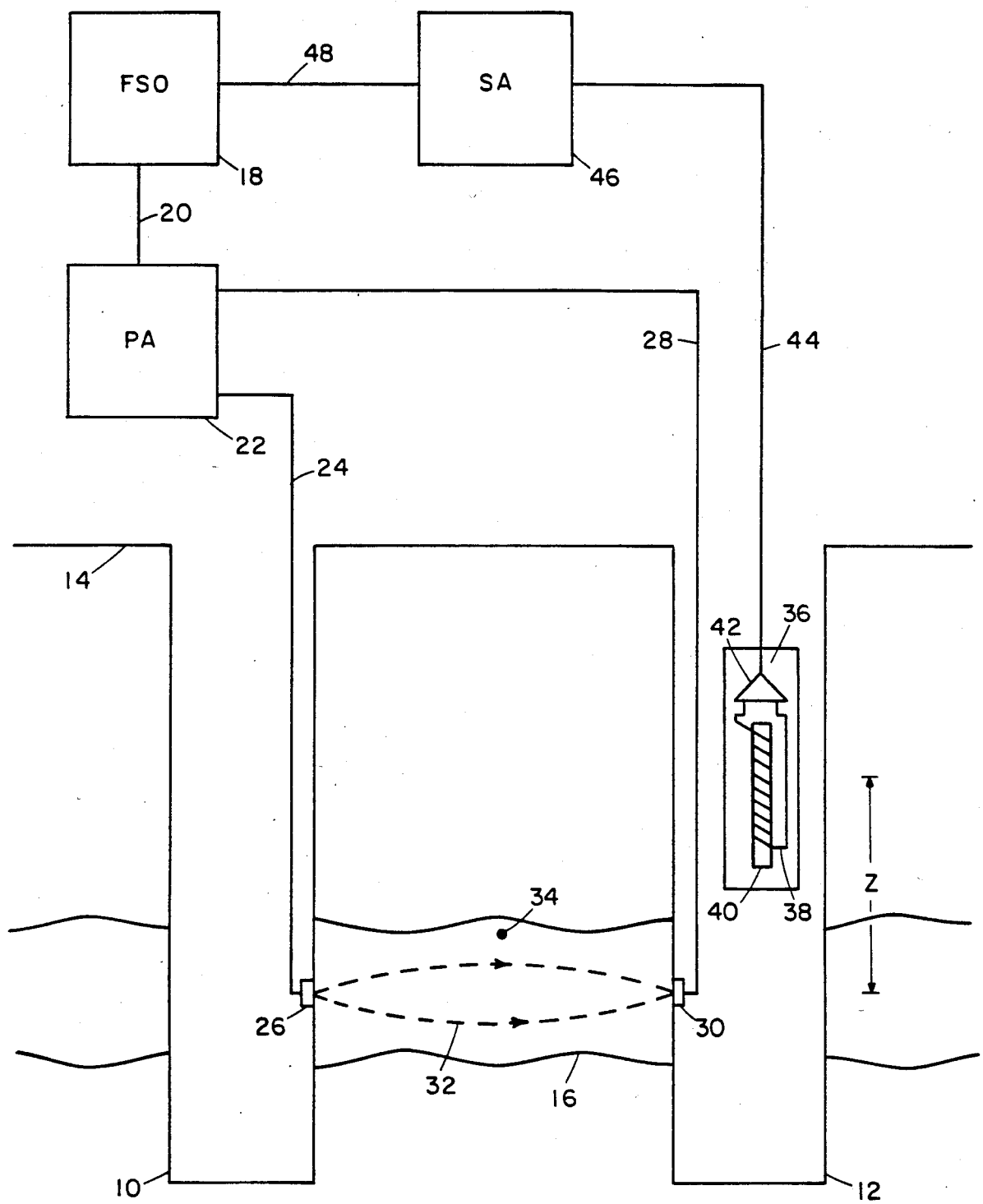
FIG. 1 is a sectional view of one preferred embodiment of the invention for remote detection and direct volumetric measurement of petroleum reservoirs appropriate for the situation in which many closely spaced drill holes exist in an established oil field.

FIG. 1 shows a preferred embodiment of the apparatus for remote sensing and volumetric measurement of petroleum reserves. This particular embodiment is appropriate when extensive drilling has already occurred in the oil field. Two boreholes, 10 and 12 respectively, have been drilled from the earth's surface 14. As is shown, the boreholes have drilled through the oil bearing formation 16. A standard frequency sweep oscillator 18 has an output which drives an A.C. power amplifier 22. This frequency sweep oscillator (F.S.O.) must be capable of slowly frequency sweeping around approximatley 2.1 kHz. and the power amplifier (P.A.) must be capable of providing significant A.C. current near the frequency of 2.1 kHz. One output of the power amplifier is attached to a cable 24 which is lowered into borehole 10 and is connected to a means of introducing current into the formation 26. The other output of the power amplifier is attached to a cable 28 which is lowered into borehole 12 and is connected to a means of introducing current into the formation 30. Therefore, A.C. current is conducted through the oil bearing formation in paths collectively identified as 32 in FIG. 1. The total A.C. current passing through the oil bearing formation produces an A.C. magnetic field throughout the oil bearing strata. For example, at a location labeled 34 within the formation, there exists an A.C. magnetic field whose vector is primarily out of the drawing. The magnitude of the A.C. magnetic field but not the frequency depends on location in the formation. The frequency of 2.1 kHz is the Larmor frequency of protons in the nominal strength of the earth's magnetic field of 0.5 gauss. Therefore, a means is provided whereby a significant portion of the oil bearing formation may be subjected to an A.C. magnetic field at the Larmcr frequency of protons in the earth's magnetic field. Furthermore, a means is provided whereby a significant portion of an oil bearing formation may be swept through a condition of nuclear magnetic resonance. The significant portion of the oil bearing formation subject to the applied A.C. magnetic field is also called the "excitation zone" of the formation. As will be rigorously defined later, this is the zone wherein the motion of the magnetic moments become substantially affected by the application of the A.C. magnetic field. In essence, the excitation zone is that zone in the formation where the application of the A.C. magnetic field causes the paramagnetism of the fluids contained therein to disappear or at least be substantially reduced in magnitude.

A borehole magnetometer assembly labeled as 36 in FIG. 1 is lowered into borehole 12 a distance Z above the center of the oil bearing formation. In this particular embodiment, the borehole magnetometer assembly includes a large number of turns of insulated wire 38 which are wound around a very high permeability magnetic core material 40 which is in turn connected to an amplifier 42. This amplifer must be stable and have high gain, extremely low noise, narrow bandwidth, and excellent low frequency response. A relatively new integrated circuit which is very well suited for this purpose is the OP-27A/E (Precision Monolithics Inc., 1500 Space Park Drive, Santa Clara, Calif. 95050). This operational amplifier has a very low input noise voltage density of 5 nanovolts per square-root hertz at a frequency of 10 hertz. The required low noise and high gain are obtained using standard electronic design principles and several OP-27A/E integrated circuits. The output of this amplifer is connected to a shielded cable 44 which leaves the borehole and is connected to the input of a standard signal averager 46. The signal averager (S.A.) obtains its reference sync. pulse via a cable 48 which is connected to the sync. pulse output of the frequency swept oscillator. Consequently, a means has been provided which measures the low frequency variation or amplitude modulation in the earth's magnetic field. Measurements at various positions Z provide a means whereby the variation in the earth's magnetic field can be measured in the vicinity of the excitation zone.

As has been briefly discussed, as matter is swept through the condition of nuclear magnetic resonance, it is expected that the original paramagnetism of a sample should decrease or vanish under certain circumstances. In this embodiment of the invention, a means has been provided to sweep a significant portion of the oil bearing reservoir otherwise also called an "excitation zone" of the formation through a condition of nuclear magnetic resonance. The application of the A.C. magnetic field at the Larmor frequency causes a randomization, or "scrambling," of the directions of the nuclear magnetic moments which were initially aligned in the magnetic field of the earth and which in turn cause the initial paramagnetism of the formation. This randomization process is also called the "excitation process" of the formation and occurs within the "excitation zone" of the formation. Therefore, as the excitation zone of the formation is swept through resonance, the paramagnetism of the oil in formation is decreased or eliminated within this zone. The paramagnetism of the excitation zone of the oil formation contributes to the total magnetic field measured by the magnetometer. Consequently, as the excitation zone of the oil formation is swept through the condition of nuclear magnetic resonance, or resonance conditions, a small decrease in the earth's magnetic field in the vicinity of the excitation zone is observed. This decrease in the magnetic field strength is directly related to the volume of liquid petroleum and water contained within the volume defined by the excitation zone in the formation.

In summary, therefore, a method which has two steps is proposed to detect the presence of unknown petroleum reservoirs in geological formations. The first step is applying an A.C. magnetic field at frequencies near or including the Larmor frequency to a portion of the oil bearing formation defined as the excitation zone of the formation, thereby placing the excitation zone of the formation into a state of nuclear magnetic resonance. This state of nuclear magnetic resonance in turn alters the natural nuclear paramagnetism of the formation within the excitation zone which results in a change in the earth's magnetic field in the vicinity of the excitation zone of the formation. The second step is while placing the excitation zone of the formation into a state of nuclear magnetic resonance, measurements are simultaneously performed detecting any change in the earth's magnetic field in the vicinity of the excitation zone due to changes in the natural nuclear paramagnetism of the excitation zone to indicate the presence or absence of petroleum and other fluids such as water within the excitation zone of the formation.

After the initial excitation of the formation, the nucleons then relax back along the earth's magnetic field direction with characteristic times called longitudinal relaxation times. The water present in formation has a characteristic longitudinal relaxation time (or ranges of times), and the petroleum present in formation also has a characteristic longitudinal relaxation time (or ranges of times). This relaxation process causes the earth's magnetic field in the vicinity of the excitation zone to return to its prior value before the excitation of the formation. A single excitation-relaxation process causes a single variation in the earth's magnetic field. A variation in the earth's magnetic field is defined by an initial decrease followed by an increase in the earth's magnetic field caused by one sweep through resonance.

In summary therefore, a method is proposed wherein the frequency of the A.C. magnetic field applied to the excitation zone of the formation is swept from a frequency below the Larmor frequency to a frequency above the Larmor frequency of the protons and other nucleons within the excitation zone where after the sweep through the Larmor frequency the protons and other nucleons which have been disrupted in alignment with the earth's magnetic field direction relax back along the earth's magnetic field direction with characteristic longitudinal relaxation times where the excitation-relaxation process results in a variation in the earth's magnetic field which is simultaneously measured to indicate the presence or absence of petroleum within the excitation zone.

This excitation-relaxation process may be repetitiously repeated by suitably adjusting the repetition rate of the sweep oscillator. The sweep oscillator repetitiously sweeps the excitation zone of the formation through a condition of nuclear magnetic resonance, thereby repetitiously amplitude modulating the paramagnetism of the formation. This excitation-relaxation process results in a repetitive variation in the earth's magnetic field which results in an amplitude modulation of the earth's magnetic field in the vicinity of the excitation zone of the formation. The amplitude modulation of the earth's magnetic field in the vicinity of the excitation zone is measured by the induction coil magnetometer. As the formation is repetitively swept through resonance, the signal averager is used to increase the signal and decrease the noise using standard experimental techniques.

In summary therefore, a method is proposed in which the frequency of the A.C. magnetic field applied to the excitation zone of the formation is repeatedly swept from a frequency below the Larmor frequency to a frequency above the Larmor frequency at such a suitable sweep rate that the protons and other nucleons within the excitation zone are driven into a state of nuclear magnetic resonance in such a manner that substantially disrupts the orientation of the protons and other nucleons in the earth's magnetic field within the excitation zone and after the sweep through the Larmor frequency the protons and other nucleons which have been disrupted in alignment with the earth's static magnetic field relax back along the earth's magnetic field direction with characteristic longitudinal relaxation times and where the excitation-relaxation process is repeated at a suitable repetition rate thereby resulting in an amplitude modulation of the natural nuclear paramagnetism of the excitation zone of the formation which results in the amplitude modulation of the earth's magnetic field in the vicinity of the excitation zone of the formation and simultaneously detecting the amplitude modulation in the earth's magnetic field to indicate the presence or absence of petroleum and other liquids such as water within the excitation zone of the formation. Such measurements ultimately provide the free fluid index, the longitudinal relaxation times of the constituent fluids, the viscosity of oil, porosity of the formation, water saturation and oil saturation, and estimations of the permeability of the formation over distances which penetrate the oil bearing formation many borehole diameters.

It is now necessary to more precisely define the conditions which result in a reduction of the paramagnetism during resonance conditions. To do this, some additional physics must be described. In what follows, it is shown that there are requirements on both the frequency sweep rate and the A.C. magnetic field strength which depend on the physical properties of the bulk petroleum reservoir.

The following physics is also necessary to demonstrate that the invention provides a practical means of sweeping the oil formation through resonance and furthermore provides a practical means to measure the resulting variation in the earth's magnetic field.

It will be understood, however, that the invention is not to be specifically limited by the theory which follows.

Figure 2:
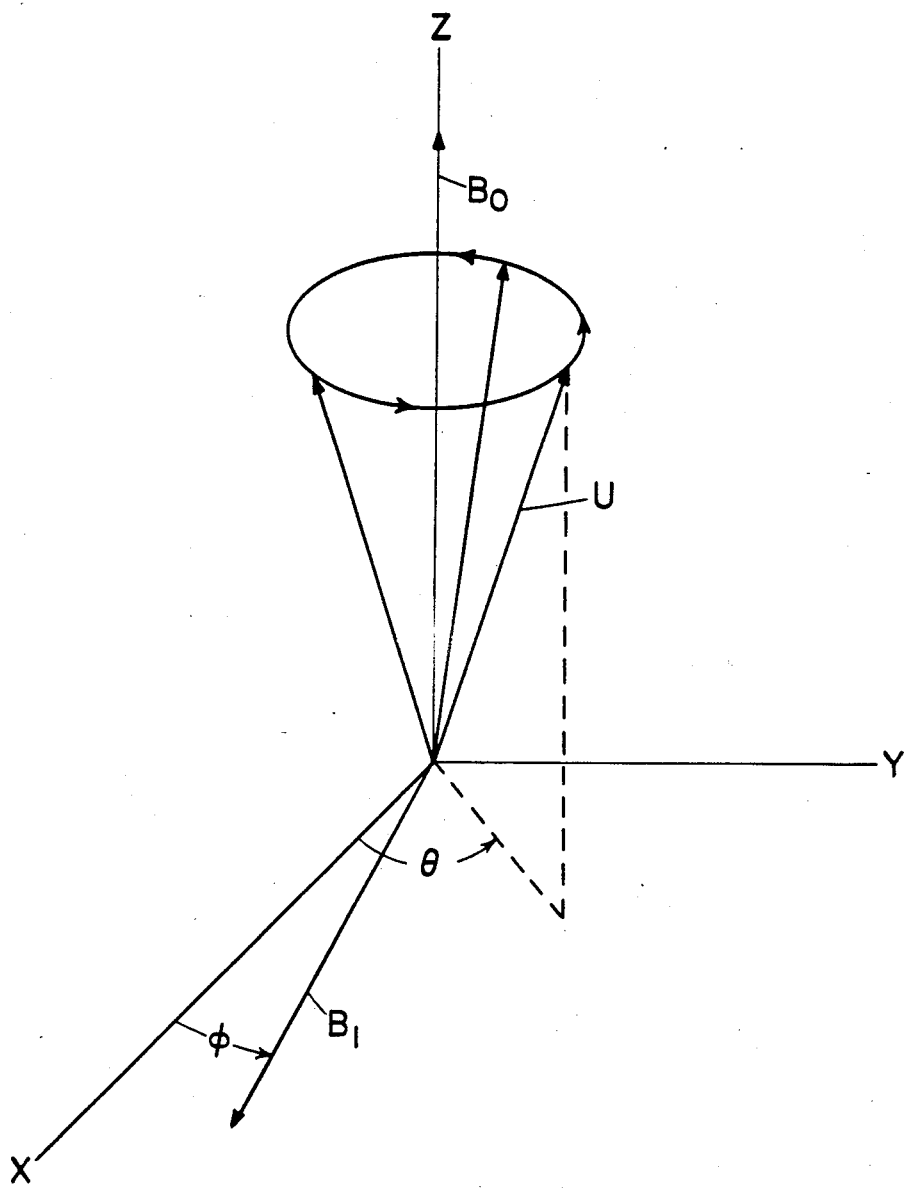
FIG. 2 is a diagram used to describe the motion of magnetic moments in an oil bearing formation during nuclear magnetic resonance conditions.

The motion of a collection of nuclear magnetic moments is described with reference to a coordinate frame as shown in FIG. 2. The magnetic field of the earth is $B_0$ and lies along the Z axis of the coordinate frame. An individual magnetic moment U precesses in a conic motion around the direction of $B_0$ in the absence of other magnetic fields. The magnetic moment executes this type of motion because the time rate of change of the vector angular momentum (dL/dt) must equal the vector torque on the magnetic moment (U X $B_0$), as shown in Eq. 1:

$$dL/dt = U \times B_0 \qquad \text{Equation 1.}$$

This type of motion is described by locating the angular position of the tip of the magnetic moment U with respect to the X axis in FIG. 2. This angular position is defined by the angle $\theta$ in FIG. 2. The time rate of change of the angle is called the angular precession frequency $w_0$. This angular frequency is related to the earth's magnetic field and to the gyromagnetic ratio of the proton $\gamma$ by the following equation:

$$w_0 = \gamma B_0 \qquad \text{Equation 2.}$$

As is shown in many elementary physics texts, Equation 2 is a consequence of Equation 1. Of course, the many individual magnetic moments fan out around the cone at different angles $\theta$ as shown in FIG. 2. However, the fact that the many magnetic moments have components along the Z axis produces a net magnetization $M_z$ along the Z direction. This effect of course produces the nuclear paramagnetism of petroleum. An external magnetic field $B_1$ is applied to the precessing magnetic moments as shown in FIG. 2. For simplicity only, $B_1$ is confined to the X-Y plane, has constant magnitude, and rotates in time through the angle $\phi$ which is defined in FIG. 2. In general, $B_1$ must or y have a non-parallel component to $B_0$ for the validity of the following analysis ($B_1$ must be at a non-zero angle to $B_0$). Defining the time rate of change of the angle $\phi$ to be the quantity w, it is well known that the condition of magnetic resonance occurs when:

$$w = w_0 \qquad \text{Equation 3.}$$

The physical significance of resonance is that energy may be coupled from the $B_1$ field into the precessing magnetic moments thus altering their motion. If the frequency of the applied magnetic field w is swept slowly through resonance, the solution to motion of the vector magnetization of the sample is given by the steady state solution to the "Bloch equations." These equations and their solution under these conditions are given in E. R. Andrew, op. cit., page 28.

In this analysis it is shown that the paramagnetism of the sample may be reduced significantly or eliminated at resonance. This phenomenon is called "saturation." In this condition, the magnetization in the Z direction, $M_z$, is reduced or eliminated. In the aforementioned reference it is shown that saturation occurs if the following mathematical condition is obeyed:

$$\gamma^2 B_1^2 T_1 T_2 \geq 1 \qquad \text{Equation 4.}$$

In this equation, $\gamma$ and $B_1$ have already been defined. The quantity $T_1$ is the longitudinal relaxation time and $T_2$ is the transverse relaxation time. These relaxation times are of importance and the physical significance that these times have upon the motion of the collection of magnetic moments is well described in T. C. Farrar and E. D. Becker, op. cit., pages 7-15. Briefly, in this case $T_1$ is the time it takes for the disoriented magnetic moments to achieve thermal equilibrium and hence realign along the Z axis after the conditions of saturation have been achieved. Therefore, $T_1$ is called the thermal relaxation time, also called the spin-lattice time. $T_2$ is the time it takes for a hypothetical group of magnetic moments which have been originally aligned in one single direction in the X-Y plane of FIG. 2 to become disoriented with their vectors fanning out and pointing at random in that X-Y plane. $T_2$ is also called the spin-spin relaxation time.

If the embodiment in FIG. 1 is to be practical, the magnitude of the A.C. magnetic field $B_1$ (the excitation field) as specified in Eq. 4 must not be impractically large. Most measurements of the thermal relaxation time $T_1$ of crude oil in formation are known to fall within the following range of times (J. D. Robinson, et al., J. Pet. Tech., 26, p. 226, 1974):

$$0.1 \text{ sec} \leq T_1 \leq 5 \text{ sec} \qquad \text{Equation 5.}$$

In U.S. Pat. No. 3,395,337, R. H. Varian (1968) has measured the following limits on $T_2$:

$$10^{-5} \text{ sec} \leq T_2 \leq 60 \text{ sec} \qquad \text{Equation 6.}$$

In the worst possible case corresponding to the minimum times as specified by $T_1$ and $T_2$, the minimum required strength $B_1$ to achieve randomization of the magnetic moments is approximately 37 milligauss. Consequently, if an A.C. magnetic field of 37 milligauss is applied to an oil bearing formation at the Larmor frequency, saturation will occur. Furthermore, it is well known that most transverse relaxation times are longer than $10^{-4}$ sec (see Eq. 6). This therefore would require a minimum A.C. field strength of only 11.7 milligauss to achieve saturation. Consequently, it has been shown that there is a mimimum A.C. magnetic field strength necessary to produce saturation which is related to the relaxation properties of the oil bearing formation.

Another separate condition for the observation of saturation is that the frequency must be swept "slowly." This is known as "adiabatic passage." In adiabatic passage, the change in the sweep rate per unit time (dw/dt) must satisfy the following condition (A. Abragam, *The Principles of Nuclear Magnetism*, Clarendon Press, Oxford, 1961, p. 35):

$$dw/dt << \gamma^2 B_1^2 \qquad \text{Equation 7.}$$

This equation shows that if $B_1$ has a magnitude of 11.7 milligauss, the maximum frequency sweep rate is approximately 100 Hz/sec. The maximum sweep rate depends on $B_1$ and this quantity in turn depends on the relaxation properties of the oil formation. Consequently, under the conditions of adiabatic passage, there is a maximum permissible frequency sweep rate applicable to a given oil bearing formation.

If the above sweep rate is exceeded, other phenomena happen which are classified as types of "fast passage." In these cases, the magnetization of the sample cannot follow the net magnetic field and none of the conditions applicable to adiabatic passage are satisfied. However, the magnetization in the Z direction, $M_z$, does in fact decrease or disappear if the following equation is satisfied (T. C. Farrar, E. D. Becker, op. cit., p. 10–15):

$$1 \leq \gamma B_1 \Delta t \leq \gamma B_1 T_1 \qquad \text{Equation 8.}$$

In Eq. 8 the transit time through resonance $\Delta t$ must certainly be less than the longitudinal relaxation time $T_1$. From Eq. 5, the minimum longitudinal relaxation time is 0.1 second and therefore Eq. 8 specifies in this worst case that the magnitude of the required A.C. magnetic field to cause excitation is approximately 0.37 milligauss. This is a very small magnetic field. For example, if an A.C. current of 10 amps (peak-to-peak) were passed through a localized area of the petroleum reservoir, the A.C magnetic field produced by this current would exceed 0.37 gauss (peak-to-peak) inside a radius of 54 meters. Therefore, useful measurements may be performed within the formation to lateral depths of at least 10 feet and up to perhaps 1000 feet from the borehole. Consequently, the invention provides a practical means to sweep significant portions of an oil bearing formation through the condition of magnetic resonance. Perhaps it should be emphasized that no polarization step is required as in the case of polarization-precession logging tools because the preferred embodiment has a resonant excitation process which requires relatively small A.C. magnetic fields.

In fact, for any distribution of A.C. currents giving rise to the A.C. magnetic field at the Larmor frequency applied to the formation, Equation 8 indirectly defines the geometry of the excitation zone wherein the paramagnetism of the formation becomes disrupted due to these applied A.C. magnetic fields. Furthermore, the size of the excitation zone may be varied at will by simply changing the amplitude of the A.C. current applied to the formation and the placement of the current carrying electrodes atttached to the formation. Since the large volume of the excitation zone can be varied at will, any signal coming exclusively from the borehole fluid may be isolated and therefore no chemical additives need be added to the drilling mud to suppress the borehole signal. For the same reasons, the signal from an irregular borehole geometry may also be isolated and therefore eliminated from influencing the estimations of the fluid saturations in formation. And lastly, the deep variable penetration afforded by the method also allows systematic identification of characteristic dimensions the reservoir such as the upper and lower surfaces, oil and water boundaries, and certain varieties of gross lateral irregularities.

The invention provides a practical method of detecting the effects of saturation and fast passage phenomena. The paramagnetism of the oil formation gives rise to a small increase in the magnetic field above the oil reservoir $\delta B(Z)$. For simplicity only, it is assumed that the resonance is due only to "unpaired protons" (also called "hydrogen-like" or "unbound"). Near the reservoir for typical situations and typical excitation zones of interest:

$$\delta B(Z=0) = u_0 \rho U^2 B_0 / 3kT \simeq 1 \times 10^{-10} \text{ gauss} \qquad \text{Equation 9.}$$

The quantities used in this M.K.S. equation include the following: $u_0$ (permeability of space); $\rho$ (number of unpaired protons/$M^3$); U (magnetic moment of a proton); $B_0$ (earth's magnetic field); k (Boltzmann's constant); and T (absolute temperature). Equation 9 is derived in C. Kittel, *Introduction to Solid State Physics*, Fourth Edition, John Wiley & Sons, New York, 1971, page 503.

Ideally, the small magnetic field change referenced in Equation 9 is driven to zero during a sweep through resonance. Consequently, the excitation-relaxation process yields approximately a $1 \times 10^{-10}$ gauss amplitude modulation in the earth's magnetic field at a frequency of approximately 1 Hz in the vicinity of the excitation zone. The engineering requirements necessary to build a sensitive induction coil magnetometer which can perform such measurements are understood. For additional information, please refer to the following: (1) G. V. Keller and F. C. Frischknecht, *Electrical Methods in Geophysical Prospecting*, Pergamon Press, N.Y., p. 237, 1966; (2) L. K. Hill and F. X. Bostick Jr., "Micropulsation Sensors With Laminated Mumetal Cores," Electrical Engineering Research Laboratory, The University of Texas, Austin, Tex., Report No. 126, May 25, 1962; (3) R. Karmann, "Optimierung des Signal/Rausch-Verhältnisses von Induktionsspulenmagnetometern für die Magnetotellurik," Dissertation, Technischen Universität Carolo-Wilhelmina zu Braunschweig, 1975; and (4) W. D. Stanley and R. D. Tinkler, a U.S.G.S. Open File Report entitled "A Practical, Low-noise Coil System for Magnetotellurics," U.S.G.S., Denver, Colo. The last reference cites constructing an induction coil with a noise level of $4 \times 10^{-10}$ gauss at 1 Hz. Resonating this induction coil at 1 Hz by suitably selecting a resonating capacitor for the parallel RLC circuit results in significantly improved performance. Furthermore, building a slightly longer induction coil with more windings of heavier gauge wire would also result in a more sensitive induction coil. Thus, the induced voltage due to the saturation of the excitation zone of the oil bearing formation may be detected over the intrinsic noise present by using known engineering techniques and by using suitably long data integration times.

Other types of background noise may cause additional difficulties, however. It is expected that the normal fluctuation in the earth's magnetic field near 1 Hz will be observable in the depths of the borehole. Simply averaging the results for a longer period of time using the signal averager will average those influences to zero in time. If this longer period of time for averaging is unacceptable, then a second induction coil may be added a distance below induction coil 36 in FIG. 1, thereby resulting in a gradiometer assumbly. A gradiometer used in a differential arrangement would cancel out fluctuations in the earth's magnetic field using standard practices in the field of magnetic measurements in the geophysical sciences. Care must also be taken to prevent swinging motion of the induction coil 36 in FIG. 1 as such motion would induce spurious signals in the induction coil. And finally, the high permeability core 40 in the induction coil 36 is known to be extremely microphonic and, therefore, a stop-and-hold method may be used to take sensitive data. A mechanism which would lock the tool in place in the borehole would be of considerable use if a stop-and-hold method were used to take data. For the purposes of clarity, gradiometers are also called differential magnetometers in the literature.

FIGS. 3, 4, and 5 show the time dependence of the experimental signals expected from the apparatus embodied in FIG. 1. FIG. 3 shows that the frequency, F, of the A.C. magnetic field is swept from a lower frequency $F_1$ through the resonant Larmor frequency $F_0$ to a higher frequency $F_2$ in a time which must be less than the longitudinal relaxation times of the oil and water fluids to be measured in the oil bearing formation. At the time $T_0$, the formation is in the condition of nuclear magnetic resonance. FIG. 4 shows the corresponding decrease and subsequent increase in the earth's magnetic field $B_0$, at the time $T_0$. This event is defined as a variation in the earth's magnetic field. And the voltage appearing across the induction coil, V, is shown in FIG. 5. The excitation-relaxation process may be repeated and as the formation is repetitively swept through a condition of nuclear magnetic resonance the variation in the magnetic field of the earth repeats periodically and so does the voltage induced in the induction coil.

The precise shape of the signal in FIG. 5 depends on the longitudinal and transverse times $T_1$ and $T_2$ of the oil and water species present in the excitation zone among other parameters such as the sweep time, etc. However, the amplitude of the variation in the earth's magnetic field is primarily dependent on the longitudinal relaxation times of the fluids present and depends little on the transverse relaxation times of the fluids present. In general, the oil and water phases in any one borehole have different $T_1$ times (or ranges of times) which allows for differentiation between oil and water. This differentiation is accomplished by varying the rate at which the formation is repetitively swept through the condition of nuclear magnetic resonance. For example, if the water species has a shorter longitudinal relaxation time $T_1$(water) than the longitudinal relaxation time of the oil $T_1$(oil) then if the repetition period T(rep) is longer than either of these times, both the oil and water species may relax back along the earth's magnetic field after excitation. Consequently, in this case, the amplitude of the voltage in FIG. 5 would reflect the sum of the signals from both oil and water. However, if the repetition period is longer than $T_1$(water) but shorter than $T_1$(oil), then the oil never has a chance to relax back along the earth's magnetic field before the next successive frequency sweep. Consequently, in this case, the amplitude of the voltage appearing in FIG. 5 would be coming primarily from the water species present after the initial first pass through resonance. In most instances, the relaxation time or ranges of times for the water present are shorter than the relaxation time for the oil species present. However, if the times were reversed in order, then obviously the oil signal could be solely discriminated by progressively shortening the repetition period.

Therefore, the amplitude of the variation in the earth's field on excitation and the longitudinal relaxation times of the fluid constituents may be found by varying the period of the periodically sweeping magnetic field. Using standard geophysical principles, such information allows the measurement of fluid parameters such as the free fluid index, the longitudinal relaxation times of the constituent fluids, porosity, water saturation, oil saturation, and estimations of the permeability over distances which penetrate the oil bearing formation many borehole diameters. Once the longitudinal relaxation time of the oil is known, then the viscosity of the oil may be deduced since the viscosity is a monotonic function of the longitudinal relaxation time. (Please see J. D. Robinson, et.al., 1974, ibid., FIG. 4, for more information.) It is also worth noting that in typical water-wetted formations, the oil is isolated from intimate contact with the rock and so the distribution of relaxation times for the oil species is usually small. By contrast, any distribution of relaxation times for the water present is possible. Furthermore, the paramagnetic impurities present in fommation are usually relatively more soluble in water than in petroleum and consequently this fact also contributes to a narrow distribution of $T_1$ times for any oil present. In addition, analysis of the $T_1$ distributions for the oil and water in formation would allow inference of many of the geometric and chemical properties of the surrounding rock using standard geophysical principles. Uses of $T_1$ distributions to infer surrounding microscopic rock structure are minor variations of the invention.

In summary therefore, a method is proposed in which the range of relaxation times of the fluid constituents and the relative volumes of oil and water in formation may be determined by suitably varying the repetition rate which is adjusted by changing the period of the periodically sweeping A.C. magnetic field and simultaneously measuring the magnitude of the amplitude modulation in the earth's magnetic field. Furthermore, the period of the repetition rate is initially chosen to be longer than the longitudinal relaxation time of any of the constituent fluids of interest in the formation and is thereafter set to progressively shorter intervals of time such that the period of the repetition rate is adjusted to be shorter than any one particular longitudinal relaxation time of any of the particular fluid constituents of interest in formation while simultaneously measuring the amplitude modulation in the earth's magnetic field in the vicinity of the excitation zone of the formation where the formation contains a variety of constituent fluids collectively called oil and water with ranges of relaxation times appropriate for those constituents in formation. And lastly, since the longitudinal relaxation times $T_1$ are much shorter for solids, only the paramagnetism of liquids information is observed (E. R. Andrew, op. cit., p. 151).

As previously described, the standard polarization-precession logging tools cannot work if the transverse relaxation times of the fluids in formation are short. The measurements performed by the preferred embodiment are not affected at all by short transverse relaxation times and, in fact, no information about such transverse relaxation times of the fluids in formation is required for the measurements of the amount of oil and water in formation. Furthermore, large magnetic field gradients caused by borehole casing and also phenomena caused by magnetic formations result in similar effects to those caused by short transverse relaxation times and therefore the preferred embodiment can perform measurements in such environments.

The total fluid volume, average fluid density, and the dimensions of portions of the petroleum reservoir may be found from the following procedure. The variation in the earth magnetic field during resonance $\delta B(Z)$ is measured for various distances Z above and below the oil reservoir. Please refer to FIG. 6, which shows a typical plot of $\delta B(Z)$ versus Z. Near the excitation zone of the oil formation, measurement of $\delta B(Z)$ yields the quantity $\rho$ in Eq. 9, which is the average number of unpaired protons/$M^3$ within the excitation zone of the formation Since the signal is only from liquids, this immediately yields the average fluid density within the formation. In region A in FIG. 6, which is in the vicinity of the excitation zone of the oil reservoir, the magnetic field decreases approximately as $1/Z^2$ (R. Bunumof, *Concepts in Electricity and Magnetism*, Holt, Rinehart and Winston, N.Y., p. 196, 1961). An inflection at point B in FIG. 6 demonstrates that the distance Z has reached some characteristic dimension of the oil field such as the thickness or the average diameter of the oil deposit. Region C shows the behavior of the magnetic field for large Z when the paramagnetic reservoir behaves as if it is a large single magnetic moment $U_T$. $U_T$ is of course the sum of all the magnetic moments in the excitation zone of the formation. Equation 10 shows that $\delta B(Z)$ decreases as $1/Z^3$ for large Z (D. Halliday and R. Resnick, *Physics for Students of Science and Engineering*, John Wiley & Sons, N.Y., p. 772, 1963):

$$\delta B(Z) = \frac{u_0 U_T}{4\pi Z^3}. \qquad \text{Equation 10}$$

Once $U_T$ is obtained by fitting the data, the total number of unpaired protons in the excitation zone of the formation may be obtained. From the known chemical composition, nuclear properties and densities of crude oil, the free fluid volume of the formation may be calculated. Furthermore, by combining this information with the information available from measurements on the longitudinal relaxation times of the fluids in formation, the following properties of the excitation zone may be determined using standard techniques in the industry: porosity, viscosity of oil, water saturation, oil saturation, and estimations of the permeability of the formation.

As described herein, the new magnetic resonance method as applied to formation evaluation is fundamentally different from any other resonance method proposed heretofore. Consequently, the repetitive excitation-relaxation process causing an amplitude modulation in the paramagnetism of the formation resulting in an amplitude modulation in the earth's magnetic field caused by repetitively applying an A.C. magnetic field at the Larmor frequency to the formation is a new physical process or "effect," and it is proposed to call this effect the "Paramagnetic Logging Effect," or PLE for brevity.

In the embodiment described in FIG. 1, electrode 26 is shown explicitly at a position deep within borehole 10. This was shown for the purpose of simplicity only so that the current lines 32 approximately follow the oil bearing formation. However, electrode 26 may be equally placed on the surface of the earth some distance from borehole 12 which is the logical extreme of allowing borehole 10 to have zero depth. The A.C. current flowing through formation then no longer follows the formation laterally but instead returns to the surface via conduction through strata separating electrode 30 and electrode 26 which is now on the surface. The A.C. magnetic field providing the excitation of the excitation zone of the oil bearing formation is then due to the A.C. current conducted down cable 28 and the simultaneous influence of the A.C. current conducted through the formation.

FIG. 7 shows another preferred embodiment of the apparatus for remote sensing and volumetric measurement of petroleum reserves. This particular embodiment is appropriate when only one borehole has been drilled in the earth. All of the numbered elements through number 48 have been defined in the descripiion of FIG. 1. These descriptions are briefly recounted in numerical order: 12-a borehole; 14-the earth's surface; 16-the oil bearing formation 18-the frequency swept oscillator (FSO); 20-output of frequency-swept oscillator connected to power amplifier; 22-power amplifier (PA); 28-cable attached to one output of power amplifier which is lowered into the borehole and attached to a means of introducing A.C. current into formation 30; 32-current return path; 34-a location in the oil bearing formation; 38-turns of insulated wire; 40-high permeability magnetic core material; and 44-shielded cable carrying output of the amplifier.

Features which distinguish the preferred embodiment from FIG. 1 are as follows. A.C. current is conducted into the formation by the electrode 30 at a location far below the oil bearing formation. This distance L below the formation is assumed to be many times the average thickness T of the oil bearing formation. A cable 50 connects the other output of the power amplifier to a surface electrode 52. Surface electrode 52 is a means by which current may be conducted from the surface of the earth to the power amplifier. Electrode 52 is a distance Y away from the borehole. Therefore, a complete circuit exists for the two outputs of the power amplifier and A.C. current is conducted through the formation by paths collectively identified as 32. It is evident that if L and Y are comparable to the depth of the oil bearing formation D, then very little of the return current passes near the borehole. Therefore, in a region near the borehole for a radius $X_0$ such that $X_0 < L$, then in this region the A.C. magnetic field is primarily due to the A.C. current conducted through the cable 28. This A.C. magnetic field produces excitation of the magnetic moments in a region around the borehole identified by the radius $X_0$. This excitation volume is shown as a shaded region in FIG. 7 and is mathematically defined in the text which follows.

An induction coil gradiometer 54 houses two separate induction coils which are arranged in a differential, subtraction or "bucking mode." Insulated wire 38 wound around high permeability core material 40 is one induction coil and insulated wire 56 is wound around high permeability core material 58 thus making a second separate induction coil. The centers of the induction coils are separated by a distance S resulting in a standard gradiometer arrangement. Standard electronic design principles are used to operate the amplifier 60 in a differential or difference mode.

Ancillary instrumentation necessary to provide additional measurements used to correct the data is contained in section 62 of the sonde. Instrumentation contained in section 62 includes but is not limited to the following: (A) an instrument which measures the inclination of the earth's magnetic field; (B) an instrument which measures the strength of the earth's magnetic field; (C) a thermometer which measures the temperature of the borehole fluids; (D) a device which senses the size of the borehole; and (E) a device which measures the density of the borehole fluids. Such individual devices are well known instrumentation in the borehole geophysics industry.

A programmable control unit (PCU) 64 is connected to the frequency sweep oscillator via cable 66. The purpose of this unit is to control the timing between sweep rates which is used to separate oil and water under various circumstances. A phase sensitive detector 68 which is capable of measuring the in-phase and out-of-phase signals with respect to the reference signal provided by cable 70 attached to the sync. pulse output of the frequency sweep oscillator is used instead of the signal averager to provide superior narrow-bandwidth detection of the signal. The sync. pulse output used is the type where a TTL level changes when a preset marker frequency is crossed during a frequency sweep. A Model 178 Programmable Waveform Synthesizer manufactured by Wavetek Inc., of San Diego, Calif., provides such a suitable waveform. A commercial example of a suitable phase sensitive detector is the Model 5204 manufactured by EG&G, Princeton Applied Research, Inc., Princeton, N.J. Standard engineering procedures are used to control the pressure and temperature of the sonde. Furthermore, standard practices are also used in the fabrication of electrode 30 and its attachment to the sonde.

The A.C. magnetic field provided primarily by cable 28 is applied to a region of the formation which subsequently disorients the magnetic moments within the excitation zone. Therefore, after excitation, the contribution that this excitation zone originally provided to the total static magnetic field of the earth is removed. The subsequent change in the earth's magnetic field produced by the excitation is therefore the negative of the contribution to the total static field provided by the excitation zone. This change is, of course, measured with the induction coil gradiometer. The following theory is representative of the current understanding of the excitation process for this embodiment of the invention. It is to be understood, however, that the invention is not to be specifically limited by the theory which follows.

The model chosen for calculating the effects due to the excitation of the formation is shown in FIG. 8. A relatively thin, cylindrical-shaped oil deposit has a radius R and a thickness T. The borehole is parallel to the Z axis and has a radius $X_h$. The earth's magnetic field $B_0$ is at an angle $\alpha$ with respect to the borehole. The dynamics pictured in FIG. 8 are rigorously correct for a magnetic field which is parallel to the borehole with magnitude $B_0 \cos \alpha$, but the final results are generally true and therefore this simplified picture is justified. An A.C. current I is passed along the Z axis through cable 28 in FIG. 7, where $I = I_0 \cos(w_0 t)$. As discussed before, the return current near the borehole is negligible in this case. This A.C. current produces a radial A.C. magnetic field $B_r$, where $B_r = B_1 \cos(w_0 t)$. Since the frequency of the A.C. magnetic field is at the Larmor frequency, $w_0$, then any magnetic moment U originally aligned along the Z axis is caused to tilt away from the Z direction through the angle $\xi$.

In the reference frame of the oil deposit, these magnetic moments execute conic motion about their respective locations. Several locations are specified in FIG. 8 as $P_1$ and $P_2$. The dotted lines in FIG. 8 show this conic motion. The magnitude of the angle $\xi$ is given by the following equation:

$$\xi = \gamma B_1 \Delta t \qquad \text{Equation 11,}$$

The quantity $\gamma$ is the gyromagnetic ratio of the proton and has a value of $2.68 \times 10^4$ radians/(sec-gauss), and $\Delta t$ is the length of time during which the current has the appropriate frequency for resonance.

The quantity $B_1$ varies with the radius away from the Z axis, X, as follows:

$$B_1(X) = \frac{u_0 I_0}{2\pi X}. \qquad \text{Equation 12}$$

Consequently, the angle $\xi$ is given by the following equation:

$$\xi(X) = \gamma \left( \frac{u_0 I_0}{2\pi X} \right) \Delta t. \qquad \text{Equation 13}$$

This shows that for a given length of time $\Delta t$, the angle $\xi$ varies dramatically with X. In this discussion, the variable $\Delta t$ is viewed as a totally independent variable. The reason for this statement is fairly evident. If a given formation has a small variation in the local magnetic field strength, then there is only a small frequency interval which satisfies the Larmor condition. Therefore, the frequency can be swept through this frequency interval in any arbitrary time interval $\Delta t$.

As the angle $\epsilon$ is increased, components of the magnetization parallel to the Z axis are produced, and components of the magnetization parallel to the plane of the cylindrical-shaped oil reservoir are also produced. It is rigorously true that, at the Z=0, the horizontal components of the magnetization produced in formation by this effect make no contribution to the axial strength of the earth's magnetic field. And in general, components of the magnetization which are parallel to the plane of the oil reservoir produce little net effect upon the axial magnetic field. Therefore, the axial magnetic field is primarily influenced by those magnetic moments which have components parallel to the Z axis. The following calculation uses the approximation that only magnetic moments parallel to the Z axis produce any net effect in the axial component of the earth's magnetic field.

A calculation of the axial magnetic field for various positions Z may be performed which integrates the magnetic dipole contributions from each elemental volume of magnetization which is weighted by the factor $\cos \xi$ at each point. An "effective excitation radius" $X_0$ is found for a given $I_0$ and $\Delta t$ where it is found that at this particular radius the contribution from the excitation volume to the axial magnetic field becomes zero. $X_0$ in MKS units is given by the following:

$$X_0 = \frac{\gamma}{\pi} \left( \frac{u_0 I_0}{2\pi} \right) \Delta t. \quad \text{Equation 14}$$

For any current $I_0$ in amperes, and any time interval $\Delta t$ in seconds, $X_0$ is given in feet by the following equation:

$$X_0(\text{feet}) = 56.0 \left( \frac{\text{feet}}{\text{amp-sec}} \right) I_0 \Delta t. \quad \text{Equation 15}$$

The physical significance of the radius $X_0$ is interesting. close to the borehole, the magnetic moments rotate through many radians unless disturbed by relaxation phenomena. The outer distance $X_0$ is that particular radius at which the moments are turned through an angle of $\xi = \pi$ radians. The entire volume bounded by this radius then contributes no component to the earth's magnetic field. Consequently, this volume is said to have undergone "excitation."

After the excitation of a portion of the oil deposit defined by the thickness T, effective excitation radius $X_0$, and diameter of borehole $X_h$, then the change in the earth's magnetic field along the direction of the borehole at a particular vertical position Z is given by the quantity $\delta B(T, X_0, X_h, Z)$, which is given by the following algebraic formula:

$$\delta B(T, X_0, X_h, Z) = (u_0/2) M_O \cos \alpha \{G(T, X_h, Z) - G(T, X_0, Z)\} \quad \text{Equation 16.}$$

where $G(T, X_h, Z)$ and $G(T, X_0, Z)$ are given as follows:

$$G(T, X_h, Z) = \frac{Z + (T/2)}{\{(Z + (T/2))^2 + X_h^2\}^{\frac{1}{2}}} - \frac{Z - (T/2)}{\{(Z - (T/2))^2 + X_h^2\}^{\frac{1}{2}}} \quad \text{Equation 17}$$

$$G(T, X_0, Z) = \frac{Z + (T/2)}{\{(Z + (T/2))^2 + X_0^2\}^{\frac{1}{2}}} - \frac{Z - (T/2)}{\{(Z - (T/2))^2 + X_0^2\}^{\frac{1}{2}}} \quad \text{Equation 18}$$

and where $M_0$, the magnetization, is given by the following:

$$M_0 = \frac{N U^2 B_0 \beta}{3 k t}. \quad \text{Equation 19}$$

and where the other parameters of interest are given by the following quantities:

$\alpha$ = angle of magnetic field from vertical (approximately 30 degrees in North America);

$u_0$ = permeability of space ($4\pi \times 10^{-7}$ henrys/meter);

N = number of protons per unit volume for pure water (approximately $6.6 \times 10^{28}$ protons/meter$^3$; for oil this number is only slightly larger);

U = magnetic moment of the proton ($1.41 \times 10^{-26}$ amp/meter$^2$);

$B_0$ = static magnetic field of the earth (nominally 0.5 gauss in North America);

$\beta$ = saturation factor of fluids in formation (ranges from 0.0 to 1.0);

k = Boltzmann's constant ($138 \times 10^{-23}$ joules/degree Kelvin used); and t = temperature in degrees Kelvin (300 degrees Kelvin used).

NOTE: Conversion factor from M.K.S. units (webers/meter$^2$) to C.G.S. units (gauss) is as follows: $10^4$ gauss/weber/meter$^2$. Equations 16 and 19 are in M.K.S. units.

Consequently, the numerical result for Equation 16 is as follows in the units of gauss:

$$\delta B(T, X_0, X_h, Z) = 2.9 \times 10^{-10} \text{gauss}$$
$$(\beta)\{G(T, X_h, Z) - G(T, X_0, Z)\} \quad \text{Equation 20.}$$

In the following graphs of the results (FIGS. 9 and 10), the radius of the borehole is chosen to be 1 foot, the fluid saturation of formation hydrocarbons (or water) is assumed to be 20%, and the earth's magnetic field is assumed to be inclined 30 degrees from the vertical, which is appropriate for much of the United States.

FIG. 9 shows a vertical profile of the change in the earth's magnetic field $\delta B(T, X_0 = 10 \text{ ft.}, X_h = 1 \text{ ft.}, Z)$ calculated for various vertical positions Z where the excitation radius is held constant and equal to 10 feet. The positive direction is along the direction of the earth's magnetic field. The results are plotted for three values of the thickness T=1, 2, and 10 feet. The variations in the earth's magnetic field on excitation for small Z are affected dramatically by the presence of the borehole, whereas for large Z they are determined exclusively by the outer geometry of the excitation zone. It is evident that the measurements are sensitive to the upper and lower fluid boundaries.

FIG. 10 shows the calculated results for measurements performed at one vertical position, Z=0, which is located in the vertical center of the oil bearing formation. In this case, the borehole tool remains vertically fixed but the excitation radius $X_0$ is progressively increased by increasing the amplitude of the A.C. current which causes the excitation. The results are plotted for three parameters of the thickness, T=1, 2, and 10 feet. This invention provides an unusual attribute, namely the ability to probe laterally into formation by simply increasing the magnitude off the A.C. current conducted through cable 28.

The minimum time required for excitation of a given volume defined by the excitation diameter $2X_0$ is given by Equation 15. If $I_0$ is 10 amps, which is a reasonable current, then the minimum excitation time $\Delta t$ for the cases cited is given by FIG. 11. For example, the minimum excitation time required for a 6 foot diameter section is 0.005 seconds and the time required for a 65 foot diameter section is 0.06 seconds. These are fast excitation times which are shorter than almost any longitudinal relaxation time $T_1$ appropriate for actual oil bearing formations as shown in Equation 5. In this embodiment, the minimum excitation time $\Delta t$ must, of course, be shorter than the longitudinal relaxation time $T_1$ of any fluid of interest. In general, for a given chosen excitation radius $X_0$, the current $I_0$ must be chosen such that the excitation time $\Delta t$ is shorter than the longitudinal relaxation time of the fluid being measured.

Equations 15 through 20 provide the basis for one method used to measure the amount of petroleum in formation within a well defined excitation zone. If the magnetic field variations are measured at the position of $Z=0$, then as the peak-to-peak A.C. current is increased, the excitation radius $X_0$ is increased and the measurements vary according to Equation 16. Therefore, the quantity $\delta B(T, X_0, X_h, Z=0)$ versus different $X_0$ may be obtained from the data. It is obvious that both T and $\beta$ may be deduced from a mathematical fit of the results because they affect the magnetic field variations through different functional relationships. For example, it is evident from Equation 16 that for the limit of $X_0=0$, the results for $\delta B(T,X_0,X_h,Z=0)$ are primarily influenced by the parameter $\beta$. And furthermore, for large values of $X_0$ such that $X_0>>T$, the results for $\delta B(T,X_0,X_h,Z=0)$ scale as $T/X_0$. Consequently, both $\beta$ and T may be easily separated from the data.

Another method is obvious to measure the quantities of $\beta$ and T. The quantity $\delta B(T,X_0,X_h,Z)$ can be measured for various distances Z with all other quantities held constant (particularly $X_0$=constant). A subsequent mathematical fit to the data results in knowledge of both $\beta$ and T because these quantities affect the data through different functional relationships. This is a second method which independently measures both $\beta$ and T. Many other methods for determining $\beta$, T, and other desired quantities based on this theory are also evident but are only minor variations of the preferred embodiment.

It should be noted here that $\delta B(T,X_0,X_h,Z)$ is the net magnetic field change from a time before excitation to a later time after the magnetic moments have become disoriented. It is the net change from before to after the excitation time $\Delta t$. However, $\delta B(T,X_0, X_h,Z)$ need not necessarily go to zero uniformly during the time interval $\Delta t$. Several oscillations in time of $\delta B(T,X_0,X_h, Z)$ may occur during the excitation time $\Delta t$ if the relaxation times are long compared to the excitation time. Such oscillations are particularly likely if $T_2$ is much longer than the excitation time $\Delta t$. In this case, the magnetic moments are rotated through different angles $\xi$ radially away from the borehole. At any one instant, for example, more moments may be "up" than "down." In the next instant more moments may be "down" than "up." As such excess number of moments drift in and out of phase, "beating" or oscillations in the earth's magnetic field may occur. Such oscillations would be expected to appear only if the magnetic field in the vicinity of the borehole is very uniform.

The physical mechanism causing such oscillations in the natural nuclear paramagnetism of the excitation zone is entirely unrelated to other oscillatory phenomena associated with various types of nuclear magnetic resonance measurements. In most nuclear magnetic resonance measurements, a coherent magnetization is prepared which precesses at the Larmor frequency and measurements are performed at the Larmor frequency appropriate for the magnetic moments present. Therefore, in the usual polarization-precession nuclear magnetic resonance methods in the earth's magnetic field, measurements are performed at the Larmor frequency which is at approximately 2 kHz. In the preferred embodiment, the natural oscillations which may occur during and after a sweep through resonance would *not* appear at the Larmor frequency but instead would appear at a frequency which is substantially less than the Larmor frequency. The appearance of the oscillations during and after a sweep through resonance and their detailed character would depend upon the amplitude of the applied A.C. magnetic field and the sweep rate through resonance. The essential feature characterizing these oscillations in the earth's magnetic field is that they are caused by an amplitude modulation of the natural paramagnetism of the oil bearing formation which is caused by repeatedly applying an A.C. magnetic field at the Larmor frequency to the formation and furthermore these oscillations occur at a frequency which is unrelated to the Larmor frequency of the moments in formation. Measurement techniques to determine $\beta$ and T can be similarly based on these oscillatory phenomena as well. Measuring the amplitude and phase of such oscillations in the natural nuclear paramagnetism of the formation would yield the same information as is extracted from the preferred embodiment.

To provide an example of how such oscillations could be used, if the magnetic field in the vicinity of the borehole is extremely uniform, the following method could be used to infer the natural paramagnetism of the formation. The PCU, or programmable control unit, shown as 64 in FIG. 7 may also be adjusted to control the relative phase of the frequency sweep oscillator. In this case, the frequency of the frequency sweep oscillator (FSO) is held constant and equal to the Larmor frequency of the nucleons in formation and the amplitude of the FSO is also left constant. However, the phase of the A.C. magnetic field is modulated in an appropriate manner to cause the excitation process shown in FIG. 12. At time $t=0$, three magnetic moments $M_1$, $M_2$, and $M_3$ are shown for various radial distances $X_1$, $X_2$, and $X_3$ from the borehole. At time $t=0$, the FSO is turned on for a length of time $\Delta t$. The magnetic moments pictured in FIG. 12 then execute motion under the applied A.C. magnetic field which has constant amplitude and a constant frequency at the Larmor frequency for the length of time $\Delta t$. The position of these moments at the time $t=\Delta t$ is shown in FIG. 12. However, at the time $t=\Delta t$ the phase of the FSO is caused to jump discontinuously to a value o 180 degrees different from what it was during the first time period. The various moments then exactly retrace their motions and come into simultaneous coincidence at a time $t=2\Delta t$. Therefore, if the phase of the A.C. magnetic field is modulated periodically, then a coherent amplitude modulation of the natural nuclear paramagnetism of the formation is produced which results in the amplitude modulation of of the earth's magnetic field in the vicinity of the excitation zone the formation which may be detected with an induction coil gradiometer at the frequency at which the phase is periodically modulated. The various parameters of interest in formation may also be measured with this phase modulation technique.

From the theoretical description provided it is evident that any means which substantially disrupts the natural paramagnetism of the oil bearing formation within an excitation zone will result in measurable effects in the earth's magnetic field. Such measurements yield many quantities of interest such as T and $\beta$. Consequently, techniques based on such oscillations during and after a sweep through resonance are minor variations of the preferred embodiment and such oscillations will be neglected in further discussions The detailed shape of the waveform of the A.C. magnetic field applied to the formation is open to many choices. For example, the frequency swept oscillator 18 in FIG. 7 may be replaced with several other devices. The A.C. magnetic field may be pulsed on and off repetitiously as long as the frequency width of the oscillator encompasses the proper spread in appropriate Larmor frequencies within the excitation zone. Furthermore, the oscillator may be intrinsically constructed to oscillate at a continuum of frequencies between the frequency limits appropriate for the Larmor frequencies within the excitation zone. Therefore, the frequency swept oscillator 18 is used for the purposes of illustration and it is understood that many other types of excitation methods may be used.

The flexibility allowed in the application of the A.C. magnetic field allows many practical methods to separate the signals due to oil and water in the formation. In many oil and water reservoirs the longitudinal relaxation times for oil and water are different. For example, in one California Oil Sand the longitudinal relaxation time for the water ($T_{1W}$) present is approximately 0.2 sec. and the oil component has a longitudinal relaxation time ($T_{1O}$) of approximately 1.0 sec. (R. J. S. Brown and B. W. Gamson, Pet. Trans., AIME, 219, p. 199, 1960). This difference in relaxation times for the oil and water normally present in any one drillhole in reservoirs can be observed if the frequency sweep of the A.C. magnetic field is properly sequenced in time.

The programmable control unit 64 in FIG. 7 which controls the frequency swept oscillator 18 controls the timing sequences of the frequency sweep of the A.C. magnetic field. FIG. 13 shows one possibility. The A.C. magnetic field is swept from a frequency lower than the Larmor frequency ($F_1$) through the Larmor frequency ($F_0$) to a frequency higher than the Larmor frequency ($F_2$) in a "sweep time interval" of $T_S$. Then the A.C. magnetic field is returned to a value of $F_1$ for a "dead time" of $T_D$. There is a frequency width corresponding to a "spread" of Larmor frequencies of the formation and therefore the formation is "on resonance" for a time $\Delta t$. The frequency sweep is repeated with a period P which is equal to the sum of $T_S$ and $T_D$.

During the excitation process, the earth's magnetic field $B_0$ in the vicinity of the oil reservoir is decreased by $\delta B$. The field then relaxes back to its prior value with a suitable longitudinal relaxation time. This excitation-relaxation process is shown in FIG. 14. As the formation is repeatedly swept through resonance, the excitation-relaxation process is also repeated at the repetition rate.

The output of an individual induction coil in the gradiometer assembly is shown in FIG. 15. During the time of excitation, a peak excitation voltage appears across the coil $V_E$. During the dead time $T_D$, the formation recovers due to thermal processes and a peak voltage $V_R$ is induced in the induction coil. The peak-to-peak sum of these two voltages is $V_{pp}$. The solid line shows the voltage for the case where only oil is present in formation which has a relatively long relaxation time. The dashed line would correspond to the case where water is present in the formation which has a relatively short longitudinal relaxation time.

A realistic mixture would, of course, be represented by a suitably weighted combination of the two curves.

Dramatically different events happen depending on whether the dead time $T_D$ is longer or shorter than the longitudinal relaxation time(s) of the fluid(s) present in formtion. If $T_D$ is *less* than $T_{10}$ (oil), then the protons of oil have little chance to thermalize and realign along the earth's magnetic field before the next successive frequency sweep. If realignment has not been achieved by the next frequency sweep, no additional discontinuity in the earth's aagnetic field will be observed. Consequently, several choices are possible. If $T_D$ is less than $T_{1W}$ and $T_{10}$, no signal from oil or water will be observed. If $T_D$ is greater than $T_{1W}$ but less than $T_{10}$, then only the water signal will be observed. If $T_D$ is longer than both $T_{10}$ and $T_{1W}$, then both the water and the oil signal will be observed. By "no signal" is meant that such a signal is significantly much smaller by comparison. Thus, measuring $V_{PP}$ for various different dead times $T_D$ is sufficient to seaarate oil and water. See FIG. 16 for the expected behavior. Here $V_{pp}$ is plotted for various dead times $T_D$ with the other variables held constant. The influence of the water and oil can be separated as shown in FIG. 16. In this discussion the differences in proton densities for oil and water have been neglected for simplicity.

The phase sensitive detector in FIG. 7 not only measures the amplitude of the signal but also the phase. The phase contains enough information to infer the distribution of relaxation times present in the borehole. Since the detection system is tuned to the frequency 1/P with the phase sensitive detector, only the sine-wave component of the changing magnetic field B(t) at this frequency is measured. A simple Fourier analysis of the waveform in FIG. 14 gives the following:

$$B(t) = \delta B \{a \cos \omega_0 t + b \sin \omega_0 t\}$$

$$\omega_0 = 2\pi/T$$

$$a = 2(P/T_1) \{1 - e^{-P/T_1}\} \{(P/T_1)^2 + (2\pi)^2\}^{-1}$$

$$b = -(4\pi)(1 - e^{-P/T_1}) \{(P/T_1)^2 + (2\pi)^2\}^{-1}$$

$$r = 2(1e^{-P/T_1}) \{(P/T_1)^2 + (2\pi)^2\}^{-\frac{1}{2}} \qquad \text{(Equation 21.}$$

where r is the amplitude, a and b are the quadrature components the sine wave in units of $\delta B$, and $T_1$ is the exponential decay time of the single fluid assumed to be present. The ratio of b/a immediately yields the longitudinal relaxation time for a single fluid as shown in Eq. 22:

$$b/a = -2\pi T_1/P \qquad \text{Equation 22.}$$

Multiple fluid components with different longitudinal relaxation times may be separated by performing measurements for different periods P.

Many other mechanisms may be used to distinguish oil and water. It is well known that the formation water is normally much more electrically conductive than oil. Consequently, if A.C. current is conducted into the oil bearing formation, the current will naturally follow the water rather than the oil. An arrangement like this is easily accomplished by placing electrode 30 at the position of L=0 in FIG. 7. If the analogous dead time $T_D$ of the A.C. current is longer than either $T_{1O}$ or $T_{1W}$, then as the peak-to-peak A.C. current is increased, first the oil signal would be seen at one current level and then the water signal would emerge at a higher current level (assuming $T_{1O} > T_{1W}$). If the dead time is longer than $T_{1W}$ but shorter than $T_{1O}$, then only the water signal would be observed. Other dead times in comparison with the longitudinal relaxation times for the fluids present may be chosen with obviously predictable results.

The high conductivity of formation water results in other potential benefits. For example, the A.C. magnetic fields shown in FIG. 8 induce secondary currents in the formation itself. These secondary currents are of course larger in the more conductive water and, depending on the chosen dead times and peak-to-peak currents chosen, the signals due to oil and water may be separated with various techniques analogous to those already discussed. These additional induced currents may actually help in the fundamental excitation process itself.

There are other mechanisms which may aid in the fundamental excitation process. For example, it may prove to be the case that, depending on the complex dielectric constant of the formation, the return currents along path 32 in FIG. 7 may actually be in phase with the applied A.C. magnetic field. In fact, the choice of L and Y in FIG. 7 could be optimized to produce this result. Consequently, such in-phase currents would actually aid in the excitation process. Furthermore, short transverse relaxation times present in many petroleum formations may also aid the excitation process as well.

In general, one may choose to have more than just one means of introducing current into the formation. For example, an additional source of current which is independently controlled with another frequency sweep oscillator and power amplifier could be attached opposite the oil bearing formation in FIG. 7 at Z=0. If the dead time of this sweep oscillator is less than $T_{1O}$ and $T_{1W}$, then the magnitude of the current in this circuit can be adjusted to "kill" the water signal. The other features in FIG. 7 in this case would remain the same, and with the water signal removed, faster and more accurate measurements can be made. Numerous other arrangements of electrodes and choices of "dead times" are obvious. Therefore, any number of electrodes may be added to independently introduce A.C. current into the formation along the length of the borehole. These extra current sources may have independent amplitudes, phases, and frequencies and may be suitably adjusted to accomplish a number of independent tasks. Furthermore, any number of additional surface electrodes, like electrode 52 in FIG. 7, may be added to the apparatus for specific purposes. These electrodes may be driven at different amplitudes, phases, and frequencies for a variety of reasons.

Quadrants around the borehole may be selectively investigated with several techniques. If electrode 52 were moved sequentially in a fixed radius around the borehole, and if electrode 30 were suitably placed in the borehole, then data taken at each position of electrode 52 would yield information about the selected "pie shaped" portion of the formation selectively excited by the excitation current. Furthermore, multiple surface electrodes placed around the drill hole could be sequentially excited, yielding similar information about sections of the formation. Therefore, the A.C. current may be selectively applied to regions of the formation, thereby allowing measurements to be obtained on predetermined quadrants of the formation around the borehole.

Using the standard arrangement in FIG. 7, it is evident from Equation 16 that the measured magnetic field variation is most sensitive to fluids close to the borehole. Unfortunately, a large portion of the signal may be due to the drilling fluids used to drill the borehole. Of course, ample accuracy of measurement may be used to subtract these unwanted contributions. Furthermore, magnetic field perturbations due to high permeability materials 40 and 58 in FIG. 7 may also frequency broaden the resonance of the borehole fluids so that these fluids are not measured at all. However, other methods may be used as well. Standard techniques using paramagnetic impurities or other magnetic suspensions added to the drilling mud may be adapted to this invention (R. J. S. Brown and C. H. Neuman, Proc. of the Soc. of Prof. Well Log Analysts, 21st Annual Logging Symposium, Lafayette, La., Paper K, 1980). These additives drastically shorten the longitudinal and transverse relation times for the borehole fluids which therefore can be used as a basis of discrimination. Another distinctly different method of subtracting the unwanted signals from borehole fluids is to add another separate insulated cable parallel to cable 28 in FIG. 7 which runs only approximately the length of the induction coil gradiometer. Small A.C. currents generated in the additional cable with dead times less than the longitudinal relaxation times of the borehole fluids would essentially remove the unwanted signals entirely.

The induction coil gradiometer shown in FIG. 7 contains two identical induction coils, each of which is sensitive enough to measure the magnetic field variations due to the PLE. Standard design principles are used in the actual construction of each coil. (See, for example, G. V. Keller and F. C. Frischknecht, ibid.; L. K. Hill and F. X. Bostick, Jr., ibid.; R. Karmann, ibid.; and W. D. Stanley and R. D. Tinkler, ibid.) One possible choice of amplification in the gradiometer is shown in FIG. 17 which uses OP-27 operational amplifiers. These operational amplifiers are cooled with either an insulated dewar system or thermoelectric coolers to keep them within proper temperature specifications. An oil fluid could fill the gradiometer for pressure compensation. Paramagnetic additives may be added to kill the unwanted signal from the oil fluid. Each induction coil has a resistance $R_C$ and inductance L. A series capacitor C is chosen such that the series network is in resonance at the repetition frequency of the measurement. In FIG. 13 the repetition period P is equal to $T_S + T_D$ and therefore the reptition frequency $F(REP) = 1/P$. The series capacitance C is chosen with the standard series resonance equation given by the following:

$$C = \frac{1}{(2\pi F(REP))^2 L} \qquad \text{Equation 23}$$

Operating the induction coils of the gradiomeer at a tuned or resonant frequency is an important design requirement on the system to maximize its performance at a given frequency. To date, most sensitive induction coil systems have been designed to operate at a continuum of frequencies for such applications as magnetotelluric work. (For a review of this subject, please refer to a paper entitled "Magnetometers for Geophysical Applications," authored by S. Breiner, in *Squid Applications to Geophysics*, edited by H. Weinstock and Willam Overton, Proceedings of the Workshop held 2-4 June 1980 at the Los Alamos Scientific Laboratory, published by the Society of Exploration Geophysicists, P.O. Box 3098, Tulsa, Okla., 1981.)

Standard low-noise design principles may be used to optimize the signal/noise ratio for this network at this frequency. (See Aldert Van Der Ziel, *Noise, Sources, Characterization, Measurement*, Prentice-Hall, Inc., Englewood Cliffs, N.J. See particularly Chapter 3 and Equations 3.23a and 3.23b on page 33.) If the repetition period is chosen to be 1 second, then this repetition time is longer than most $T_1$ times appropriate for oil reservoirs as is necessary. Therefore, at the repetition frequency of 1 Hz, the optimum resistance of the induction coil for the current and noise specification of the OP-27 is approximately 1,000 ohms. Under these circumstances the additional noise power contributed by the amplifier is only a factor two greater than the theoretical limit of $4 k T \Delta f$, where k is Boltzmann's constant, T is the absolute temperature, and $\Delta f$ is the frequency bandwidth of the detection circuit. In this case the bandwidth of the detection system is designed to be 1 Hz and the quality factor of the coil is approximately 1 so that the series resonant circuit is critically damped.

As shown in FIG. 17, the outputs of the circuits for OOIL 1 and COIL 2 are connected to the next stage in the circuit, the difference/sum circuit marked as "DIFF/SUM." In the difference mode, the induction coil system acts like a gradiometer. In the sum mode, the assembly acts like a larger single induction coil. Standard design principles are used to establish the system bandwidth, provide additional gain and to provide discrimination against induced voltages from the A.C. magnetic field used to cause the excitation, etc.

Standard voltage amplification with induction coils tuned for parallel resonance may also be used as the maans of detection. FIG. 18 shows such an arrangement. The gradiometer contains two induction coils, a sense coil, and a reference coil. The sense coil is to be closest to the formation to be measured. A commercially available induction coil which has the required sensitivity necessary for such measurements is the Model MTC-4SS induction coil manufactured by Geotronics, Inc., Austin, Tex. More sensitive custom coils must be made, however, to reduce data acquisition time. The capacitor $C_1$ is chosen to resonate the sense coil at the detection frequency of interest (1/P in FIG. 13). Equation 23 applies to this case as well for computation of $C_1$ if the inductance of the sense coil is known. $C_2$ is then chosen such that the reference coil is resonated at precisely the same frequency as the sense coil. $R_1$ is a conveniently chosen resistor such that the sense coil has a known Q ($Q=wL/R$, where w is the angular frequency, L is the inductance of the coil, and R is the resistance of the coil). The Q sets the shape of the response of the induction coil versus frequency. $R_2$ is then chosen such that the shape of the frequency response of the reference coil is identical to the frequency response of the sense coil. The amplification is provided by several low-noise amplifiers. A good choice for many coils would be the Model 5004 amplifier manufactured by EG&G Princeton Applied Research, Inc., Princeton, N.J. The phase shifter allows adjustment of any phase difference between the signals from the sense coil and the reference coil. The gain adjust electronics provides for differences in gain in the system. And the differential amplifier subtracts the two signals from the sense coil and reference coil and is the output of the gradiometer.

The active balance of the gradiometer may be accomplished by at least two methods. First, a common A.C. magnetic field at the repetition frequency may be applied artificially to both induction coils with a solenoid, and the balance may be achieved directly. Secondly, direct monitoring of the fluctuations in the earth's magnetic field, the micropulsations, could allow balance to be achieved. These micropulsations at any frequency of interest in the depths of the borehole are expected to be at least several orders of magnitude larger than the desired signal strength. (See for example, J. A. Jacobs, *Geomagnetic Pulsations*, Springer-Verlag, N.Y., 1970.) Therefore, it is essential to balance the gradiometer accurately if time for measurement is to be minimized. It should be noted that the phsse sensitive detector shown in FIG. 7 could be replaced with any type of phase-dependent measurement system such as a computer-based system with suitable software. In typical practice the computer system replacing the phase sensitive detector should also balance the gradiometer in real time by continually changing $C_2$ and $R_2$ as required. Standard electronic design principles are used to accomplish these functions.

If the previously described sensitivity were not enough, very pure copper wires could be used to wind the induction coil and it could be cooled with liquid nitrogen. Cooling the coils would result in two benefits. The first is that the Johnson noise power per unit bandwidth coming from the coils scales as the absolute temperature and would be reduced by a factor of 4.8. Furthermore, the resistivity of the wires would decrease by roughly a factor of 10. The increase in sensitivity in this case is the square root of the product of these numbers. Consequently, a potential increase in sensitivity by a factor of 7 is possible by cooling the coils with liquid nitrogen.

Many other improvements in the design of induction coils have also been conceived. The high permeability cores may be fitted on the ends with spherical terminations which would effectively allow the earth's field to couple into the long slender cores more efficiently. Such refinements could gain at least a factor of 2. Furthermore, perhaps winding the coils with different diameter wires on various layers could help optimize the design. And lastly, the high permeability cores of the induction coils may be fabricated from solid rod material instead of the conventional laminations at very low repetition frequencies which may also considerably increase the sensitivity of the induction coils below 1 Hz.

If the cable 28 in FIG. 7 causes serious pick-up problems at the excitation frequency in the induction coils, an improvement in the design of the apparatus is immediately possible. The cable 28 could be separated physically and attached to either end of a metal tubing surrounding the induction coil gradiometer 54. Therefore, current would be conducted by the metal tube surrounding the induction coils. Since no A.C. magnetic fields are produced on the interior of such a metal tube, this geometry should minimize any pick-up problem at the excitation frequency.

The gradiometer in FIG. 7 has many virtues which lends itself to this application. Any unwanted environmental disturbances which affect each induction coil equally does not affect the measurement. For example, coherent vibrations due to earthquakes or local machinery do not affect the output of the gradiometer. Normal fluctuations in the earth's magnetic field are expected to penetrate the depth of boreholes and the gradiometer eliminates their unwanted presence. (See for example W. H. Campbell, *Geomagnetic Pulsations*, Academic Press, New York, N.Y., 1967). Furthermore, the influence of borehole fluids may be minimized with the gradiometer under certain circumstances. The gradiometer may be viewed as a device which measures the PLE with one coil and uses the second coil to subtract unwanted environmental noise. This type of operation therefore implies that the PLE varies dramatically over the distance of separation S in FIG. 7. The rapid variation of the effect with Z as evidenced in FIG. 9 for small excitation diameters satisfies this requirement. Under circumstances which do not satisfy the requirement on S then the coils can be run in alternate modes of "difference" or "sum" as shown in FIG. 17. Furthermore, the spacing between the individual induction coils will be optimally selected to minimize the effect of micropulsations while maximizing the peak-to-peak voltage from the PLE. Another solution to eliminating the fluctuations in the earth's magnetic field would be with the use of another independent induction coil located on the surface of the earth. Such "surface" signals could be subtracted suitably from the measurements, yielding accurate results.

The physics of the energy transfer process involving the induction coils during the excitation-relaxation process is also interesting. During excitation, energy is transferred from the A.C. magnetic field to the collection of magnetic moments in formation. After excitation the magnetic moments reorient along the earth's magnetic field into lower potential energy states and therefore give up energy in this process. The induction coil of course senses the changes in the earth's magnetic field during either process.

Perhaps it should be emphasized that any device which measures the appropriate variations in the earth's magnetic field at the repetition frequency and physically fits into a borehole is suitable for this work. In particular, squid magnetometers may be fabricated to perform such measurements. More sensitive optical pumping and proton precession magnetometers may be fabricated to accomplish the task. For a review of the relative sensitivity of such magnetometers, the reader is referred to the book edited by H. Weinstock and William Overton already referenced. Furthermore, fiberoptic magnetometers appear to have great potential for achieving the required sensitivity.

It should be apparent that the Paramagnetic Logging Effect can be measured even if steel casing surrounds the borehole. An embodiment of the invention is shown in FIG. 19 which allows measurement of the effect in cased holes. All of the numbered elements through element number 70 shown in FIG. 19 have already been defined in the description of FIGS. 1 and 7. In addition, borehole casing 72 surrounds the borehole. A triggered single pulser 74 (abbreviated TSP) has been attached to the cable carrying the frequency marker output of the frequency sweep oscillator (70). The output of the TSP is attached to the reference input of the phase sensitive detector with cable 76. The purpose of the TSP is to make the response of the phase sensitive detector invariant to waveform changes from the marker output of the frequency sweep oscillator. A housing 78 surrounds the induction coil assembly.

Electrode 30 is placed in contact with the casing above the induction coil gradiometer assembly in the embodiment shown in FIG. 19. Since the borehole casing is more conductive than the local formation, significant current $I_\sigma$ is conducted downward along the casing before it is subsequently returned through the formation to electrode 52. This downward flowing current gives rise to an A.C. magnetic field on the exterior of the casing similar in nature to the A.C. magnetic field produced by an insulated cable in the open borehole case. Equation 12 describes the radial dependence of this A.C. magnetic field causing the excitation in formation. Furthermore, other excitation mechanisms dependent on the local conduction of the A.C. current may aid the excitation process and have already been described. Therefore, an excitation zone shown as the shaded region in FIG. 19 may be defined in the presence of the borehole casing.

As the A.C. magnetic field is frequency swept through resonance repetitively, the PLE causes an amplitude modulation in the earth's magnetic field at the repetition rate. Low-frequency A.C. magnetic fields parallel to a long steel pipe are not affected dramatically by the presence of the pipe. Magnetic fields perpendicular to the steel pipe are, of course, dramatically shielded. Therefore, as long as there is a component of the magnetic field variation along the long axis of the borehole casing, the PLE can be measured through the casing. This question has been experiment tally investigated as well.

A 95 inch long, $11\frac{7}{8}$ inch I.D. air core solenoid was constructed to test the attenuation of longitudinal A.C. magnetic fields applied to an 85 inch long length of $9\frac{5}{8}$ inch O.D. type P-110 borehole casing (0.475 inch wall thickness, manufactured by Nippon Steel, Inc., and provided by Pipe Consultants, Inc., in Houston, Tex.). The A.C. magnetic field inside the casing was measured with an air core induction coil. The attenuation factor $\eta(\{B_{pp} \text{ in casing}\}/\{B_{pp} \text{ no casing}\})$ is plotted versus frequency in FIG. 20. Below 3 Hz the attenuation is less than 25%, and below 10 Hz the attenuation is below 50%. Therefore, the low frequency amplitude modulation in the earth's magnetic field parallel to the axis of the borehole casing is measurable through the borehole casing. These results also find theoretical collaboration in an article entitled "Electromagnetic Shielding of Sources Within a Metal-Cased Bore Hole," J. R. Wait and D. A. Hill, I.E.E.E. Transactions on Geoscience Electronics, Vol. GE-15, No. 2, 1977, p. 108.

Oddly enough, the presence of the borehole casing may dramatically improve the performance of the induction coil gradiometer. Inside the borehole casing, the magnetic field is caused to become nearly parallel to the axis of the induction coil gradiometer. Therefore, spurious induced voltages due to small angular movements of the induction coil would vary as the square of the angular movement as opposed to a linear dependence if the magnetic field were instead at a large angle with respect to the induction coil gradiometer. For similar reasons, the housing surrounding the induction coil itself may intentionally be constructed from high permeability materials to help reduce spurious voltages induced in the coil due to small angular movements of the induction coil gradiometer. Therefore, the housing 78 surrounding the induction coil may intentionally be fabricated from high permeability material.

FIG. 21 shows features of a practical borehole tool used to measure the Paramagnetic Logging Effect inside a well bore which has been reinforced with borehole casing 72. As previously described, windings 38 and 56 surrounding high permeability materials 40 and 58 respectively comprise the two induction coils. The capacitors $C_1$ and $C_2$ tune the induction coils for parallel resonance, and resistors $R_1$ and $R_2$ make the Q's of the induction coils identical. The minimum contents of the ancillary instrumentation package 62 have already been described. The outer case of the borehole tool is 78. In addition, voltage amplifiers 80 and 82 provide signals to the signal processing instrumentation package 84 in the sonde.

The signal processing instrumentation includes a means to adjust relative phase differences and gains between the two induction coils and also subtracts the signals from the two coils. The differential output is provided to the phase sensitive detector in FIG. 19 by cable 44. This cable is a multiple-conductor cable as is widely used in borehole environments and can support a number of data paths which also allows analogue communication with the surface. Obviously, bidirectional digital transmission devices could equally be included in the processing instrumentation. If the measured signal is digitized, then this digital signal could be properly analyzed by a computer on the surface instead of the analogue phase sensitive detector shown in FIG. 19. This is certainly a minor variation of the invention as any phase sensitive instrumentation technique, analogue or digital, may be used to measure the PLE.

As described previously, high permeability material may be chosen to surround the induction coil to reduce the influence of motion on the output of the gradiometer. One of several cylindrical structures labeled as 86 in FIG. 21 could therefore be constructed from high permeability material. The high permeability material may also be used to reduce the production of eddy currents in the casing which would decrease the sensitivity of the induction coils. This reduction of eddy currents occurs because the magnetic flux lines which would normally radiate out of the high permeability cores 40 and 58 passing through the borehole casing 72 become instead trapped inside the borehole casing and pass through the high permeability material 86. That material may itself be slotted along its length to further reduce eddy current losses. In fact, the high-permeability material may itself be fabricated from a large number of thin sheets of material which are electrically insulated from one another.

Turns of wire 88 on the several cylinders labeled as 86 form several solenoids. The cylinders 86 may be insulating material such as fiberglass or may be high permeability material as described, depending on design requirements. The solenoids are used to balance the gradiometer by applying a known A.C. magnetic field at the detection frequency and balancing for null. As another separate issue, the solenoids could also be used to apply a separate static magnetic field along the direction of the borehole to the formation. This action would artificially enhance the magnetization of the formation in the direction of the earth's magnetic field and this magnetization could be caused to be disrupted by application of a suitably frequency-swept A.C. magnetic field in the usual experimental measurement of the PLE. As this is an obvious extension of the present invention, no further details of this method of measurement will be described.

A mechanical arm 90, attached to the sonde, has a conducting pad 92 which is held in contact with the borehole casing by usual methods in the industry. Such a mechanism serves to center the sonde, prevent vibrations since slack can be introduced into the cables 28 and 44 supporting the weight of the sonde, and also serves to introduce the frequency-swept A.C. current onto the casing via cable 28. Cable 28 is attached to the conducting pad 92 which is otherwise insulated from the sonde and this pad, or electrode, provides the majority of the A.C. current causing excitation in the formation.

In addition, mechanical arm 94 is also attached to the sonde and supports another conducting pad 96 which makes contact with the casing. Current is provided to this conducting pad through $R_3$ which is a resistor in series with cable 28. The insulated cable 98 consequently carries a relativey small A.C. current, and the frequency-swept A.C. magnetic field generated by this wire causes only fluids in the borehole to be continually excited as previously described and therefore prevents signals from borehole fluids to confuse interpretation of the measurements from the sonde. Other combinations of conducting pads, extra solenoids, and extra A.C. current-carrying cables can be used for analogous purposes and are obvious extensions of the present invention.

Furthermore, it is also possible to add any number of desired induction coils within the sonde. These induction coils could work in unison in a variety of ways to produce the effects desired from a simple two-coil gradiometer and would help to eliminate spurious effects on the data by variable wall thickness of the borehole casing. The addition of such extra induction coils to the sonde are minor variations of the present invention. In principle, any number of magnetometers of any type could be incorporated within the dfferential magnetometer assembly to accomplish the measurement tasks.

Pressure and temperature within the sonde is controlled with the usual methods in the industry. In addition, the outside housing of the sonde 78 may be fabricated from laminations of fiberglass and concentric stainless steel cylinders which have been slotted along their length. Such construction would have strength against pressure and would minimize eddy current losses.

The presence of the borehole casing may aid measurement of the PLE in other ways. For example, the current $I_\sigma$ in FIG. 19 flows on the outside of the borehole casing and therefore produces little A.C. magnetic field inside the casing. Therefore, spurious signals induced in the induction coil gradiometer due to the A.C. magnetic field caused by flowing A.C. currents may be minimized by the presence of the casing. Furthermore, the borehole casing distorts the field strength of the ambient earth's magnetic field. Therefore, there will be a predictable frequency causing resonance at a given radial distance from the borehole casing. Therefore, frequency sweep intervals may be chosen to cause a number of different excitation geometries surrounding the borehole. For example, it is evident that toroidal excitation regions around the borehole casing may be produced by judiciously selecting the frequency sweep interval. And finally, the presence of the borehole casing provides a firm surface which may be used to firmly lock the borehole tool in place, thereby preventing swaying motion of the gradiometer.

It has been assumed so far that the effective excitation radius $X_0$ does not intersect a lateral boundary of the oil field. If the excitation A.C. magnetic field is increased to the point where $X_0$ intersects a lateral boundary, then a plot of $\delta B(T, X_0, X_h, Z)$ versus $X_0$ with the other variables held constant will show an inflection in the data. With sufficient accuracy it is possible under many circumstances to identify this boundary. If instead the borehole missed a close-by oil field, continually increasing the excitation field until a magnetic field variation appeared would identify the radial distance of that nearly missed reservoir. And furthermore, if an oil reservoir were deposited in large "swiss cheese" pockets, this geometry would also be readily identifiable from the data. It is expected that other geometric peculiarities will be evidenced in singularities and inflections in the experimental results. Such measurements are minor variations of the preferred embodiment.

The major problems in measuring the PLE are expected to be minimizing environmental disturbances within the synchronous detection bandwidth. Such problems include microphonics of the gradiometer which can be minimized by isolating the gradiometer from vibrations and minimizing stresses on the high permeability cores inside the induction coils. Furthermore, temperature stabilization of the induction coils within the gradiometers may ultimately prove to be important to minimize such streses. Ultimately the fiber-optic magnetometers which have already been briefly described may eventually prove to be superior in measuring the PLE as these instruments are not as sensitive to vibrations as are the induction coil gradiometers.

Another embodiment of the invention is shown in FIG. 22. This embodiment is appropriate where no drill-hole has been drilled anywhere in the vicinity of the oil deposit. All of the numbered elements have already been described in FIG. 19. A.C. current is passed through the formation between electrodes 52 and 30 which is repetitively frequency swept hhrough the Larmor frequency of the nucleons in the oil reservoir. This frequency swept A.C. current provides a repetitively frequency-swept A.C. magnetic field which must be sufficient in magnitude to cause excitation within the shaded region of the formation in FIG. 22. The PLE results in the amplitude modulation of the earth's magnetic field in the vicinity of the petroleum reservoir.

The amplitude modulation of the earth's magnetic field above the oil reservoir on the earth's surface is sensed with an induction coil gradiometer, where the two induction coils are configured as shown in FIG. 22. The induction coil vertically over the oil deposit comprising windings 38 and high permeability material 40 senses the amplitude modulation of the earth's magnetic field caused by the repetitive excitation of the oil bearing formation. Another induction coil located a distance H from the first induction coil comprising windings 56 and high-permeability material al 58 is used to subtract common-mode fluctuations in the earth's magnetic field measured by both induction coils in the usual manner already described. The differential output of the gradiometer is provided by subtracting the individual outputs of the induction coils using differential amplifier 60.

The limitations of the power output of power amplifier 22 establishes the depth of investigation, D, of the invention. For a given power output, the depth of investigation will vary with different types of formations. Once a depth of investigation is chosen, then the separation of the electrodes should be chosen such that $Y = D$ approximately. The effective depth of investigation will also be limited by the sensitivity of the induction coils. These surface monnted induction coils could also, obviously, be replaced with any magnetic field sensing element such as squids, or large air core induction coils with many turns, and a diameter of one mile or more. Furthermore, A.C. current need not necessarily be passed through the formation as shown in FIG. 22 to cause excitation. Instead, a wire could be used to connect electrodes 52 and 30 directly together which has many turns forming a very large diameter coil on the surface of the earth which could also provide the necessary A.C. magnetic field to cause the excitation of the formation.

There are a very large number of other embodiments of the invention. Any means may be used to cause the oil bearing formation to pass through the condition of nuclear magnetic resonance. Consequently, any means may be used to apply an A.C. magnetic field to the oil bearing formation near the Larmor frequency. Different methods of applying this A.C. magnetic field to the oil strata include but are not limited to the following: (1) passing A.C. current through the formation from one or more boreholes to one or more surface electrodes; (2) passing A.C. current between two or more boreholes; (3) passing A.C. current through the earth between two or more electrodes placed on the earth's surface; (4) using one or more A.C. current-carrying circular loops on the surface of the earth; (5) using one or more rectangular shaped A.C. current-carrying coils on tha surface of the earth; (6) inducing an A.C magnetic field in the pipe surrounding a borehole with A.C. current-carrying coils on the surface of the earth; (7) inducing an A.C. magnetic field in the pipe surrounding a borehole using an A.C. current-carrying coil inside the borehole; (8) using any borehole tool which generates an A.C. magnetic field by any means; (9) passing A.C. current from pipe surrounding a borehole into the earth; and (10) in an uncased hole where A.C. current is passed between two or more electrodes attached to the formation along the length of the open borehole; etc.

Many of these surface methods would require large A.C. power sources since the statistical median resistivity of the surface overburden is 143 ohm-meters in the United States which results in an electromagnetic skin depth of only 134 meters at 2.1 kHz (G. V. Keller and F. C. Frischknecht, op. cit., p. 40). Furthermore, all varieties of pulse methods may be used provided the methods produce the condition of resonance in the oil bearing formation. And, of course, any means with sufficient sensitivity may be used to measure the variation in the earth's magnetic field as the formation is swept through resonance. This includes the possbility of using a very large area induction coil on the surface of the earth with many turns of wire and a diameter of one mile.

And finally, the invention explicitly exploits the properties of nuclear magnetic moments such as unpaired protons. However, it is obvious that the method and apparatus can be applied to the nuclear, electronic, atomic, or molecular properties of petroleum which have similar gyromagnetic features. For example, it is known that there are a vast variety of known impurities in petroleum and connate water (*Evaluations of World's Important Crudes,* 1973, and *A Guide to World Export Crudes,* 1976, both published by The Petroleum Publishing Company, P.O. Box 1260, Tulsa, Okla.; W.

Duchscherer, Jr., *Geochemical Hydrocarbon Prospecting with Case Histories*, Penwell Books, Tulsa, Okla., 1984; and V. Valkovik, *Trace Elements in Petroleum*, Penwell Books, Tulsa, Okla., 1978). Electronic paramagnetism may be caused by atoms and molecules possessing an odd number of electrons, free atoms and ions with partially filled inner shells, ionic compounds of all varieties, rare earth and actinide elements, several compounds with an even number of electrons, organic biradicals, and many metals (C. Kittel, op. cit.). Many of these compounds have "unpaired" electrons which have electronic magnetic moments which cause the electronic paramagnetism. Therefore, it is expected that a large number of impurities in crude petroleum will exhibit the phenomenon of electronic paramagnetism. The electron's magnetic moment is some 658 times stronger than the magnetic moment of the proton, and therefore minute concentrations of electronic paramagnetic impurities would give rise to measurable paramagnetic effects.

The apparatus shown in FIGS. 1, 7, 19, and 21 are employed to measure the presence of such electronic paramagnetic impurities provided the frequency of the A.C. magnetic applied to the excitation zone of the formation is appropriate for the Larmor frequency of the electronic paramagnetic substances in formation. The frequency for single electronic paramagnetic substances is approximatley 1.4 megahertz in the earth's magnetic field of approximately 0.5 gauss. Therefore, periodically sweeping the electronic paramagnetic substances through a state of electronic paramagnetic resonance would periodically disrupt the paramagnetism within the excitation zone of the formation. This periodic disruption of the paramagnetism in the formation would result in the amplitude modulation of the earth's magnetic field in the vicinity of the excitation zone. The amplitude of the modulation of the earth's magnetic field would indicate the presence or absence of electronic paramagnetic impurities. The respective longitudinal relaxation times of the impurities measured by selectively changing the repetition rate would serve to specifically identify the chemical nature of the impurities. The presence of certain paramagnetic impurities would serve to indicate that certain formations contain petroleum and would provide information about the chemical nature of the reservoir. As is evident from the discussion, at least several varieties of paramagnetism may be present in formation simultaneously: nuclear paramagnetism, electronic paramagnetism, etc.

In fact, any gyromagnetic substance simultaneously possessing both intrinsic angular momentum and an intrinsic magnetic moment exhibits the phenomenon of magnetic resonance and has a particular gyromagnetic ratio which results in a specific Larmor frequency appropriate for the gyromagnetic substance in the earth's magnetic field. That gyromagnetic substance would also necessarily exhibit the phenomenon of paramagnetism in the earth's magnetic field. Application of an A.C. magnetic field at the Larmor frequency appropriate for the gyromagnetic substance would disrupt the paramagnetism of the gyromagnetic substance within an excitation zone of the formation containing that substance. This disruption of the paramagnetism of the gyromagnetic substance within an excitation zone of the formation would result in a variation in the earth's magnetic field in the vicinity of the excitation zone. Repetitively frequency sweeping the A.C. magnetic field through the Larmor frequency of the gyromagnetic substance thereby repetitively placing a significant portion of the formation containing the gyromagnetic substance into a state of magnetic resonance would result in an amplitude modulation of the paramagnetism of the substance within the excitation zone of the formation. This modulation of the paramagnetism in turn would cause an amplitude modulation of the earth's magnetic field in the vicinity of the excitation zone of the formation. The amplitude of the modulation in the earth's magnetic field would serve to indicate the concentration of the gyromagnetic impurity present in the excitation zone of the formation. The measurement of the respective longitudinal relaxation times of the gyromagnetic substances by selectively varying the period of the repetition of the frequency sweeps through resonance would serve to specifically identify the gyromagnetic substances. The presence of a substance, or impurity, in the formation would serve to identify the chemical characteristics of the petroleum reservoir and locate unknown oil bearing formations as well.

While the above description contains many specificities, these should not be construed as limitations on the scope of the invention, but rather as exemplification of preferred embodiments thereof. As has been briefly described, there are many possible variations. Accordingly, the scope of the invention should be determined not only by the embodiments illustrated, but by the appended claims and their legal equivalents.

What is claimed is:

1. Apparatus for remote detection and volumetric measurement of at least a portion of a remote petroleum reservoir in a geological formation whereby said apparatus is located on the surface of the earth and vertically above said remote petroleum reservoir, and comprising means for causing A.C. current at a frequency substantially equal to the Larmor frequency of the nucleons contained within said portion of the remote petroleum reservoir to flow through the geological formation whereby an A.C. magnetic field is applied to the remote petroleum reservoir to place a portion of the petroleum reservoir into a state of nuclear magnetic resonance which therefore causes a change in the paramagnetism of the portion of the remote petroleum reservoir thereby resulting in a change in the earth's magetic field in the vicinity of said portion of the petroleum reservoir which also causes a change in the magnetic field on the surface of the earth above the petroleum reservoir, said means comprising two or more electrodes in electrical contact with the surface of the earth for conducting current thru the formation, and means on the surface of the earth for simultaneously measuring the resulting change in the earth s magnetic field above said remote petroleum reservoir to provide an indication of the presence or absence of petroleum and other fluids such as water within said portion of the petroleum reservoir.

2. A method of detecting the presence of at least a portion of petroleum reserves in a remote subterranean oil bearing formation which comprises the steps of:

(a) generating an A.C. magnetic field produced by A.C. current carrying conductors located on the surface of the earth, and (b) applying said A.C. magnetic field to a remote subterranean oil bearing formation at frequencies near and including the Larmor frequency of the nucleons in any oil and water present in said subterranean oil bearing formation which is at an angle with respect to the earth's magnetic field to bring a portion of the oil reserves into a state of nuclear magnetic resonance to reduce the nuclear paramagnetism of said portion of the petroleum reserves, and (c) simultaneously detecting any change in the total magnetic field of the earth with at least one magnetic sensor located on the surface of the earth whereby to indicate the presence or absence and the extent of the petroleum reserves located in said remote subterranean oil bearing formation.

3. Apparatus for remote detection and volumetric measurement of at least a portion of a remote petroleum reservoir in a geological formation whereby said apparatus is located on the surface of the earth and vertically above said remote petroleum reservoir, and comprising means for causing A.C. current at a frequency substantially equal to the Larmor frequency of the nucleons contained within said portion of the remote petroleum reservoir to flow through an electrical conductor located on the surface of the earth whereby an A.C. magnetic field is applied to the remote petroleum reservoir to place a portion of the petroleum reservoir into a state of nuclear magnetic resonance which therefore causes a change in the paramagnetism of the portion of the remote petroleum reservoir thereby resulting in a change in the earth's magnetic field in the vicinity of said portion of the petroleum reservoir which also causes a change in the magnetic field on the surface of the earth above the petroleum reservoir, and means on the surface of the earth for simultaneously measuring the resulting change in the earth's magnetic field above said remote petroleum reservoir to provide an indication of the presence or absence of petroleum and other fluids such as water within said portion of the petroleum reservoir.

4. A method of detecting the presence of at least a portion of petroleum reserves in a remote subterranean oil bearing formation which comprises the steps of:

(a) generating an A.C. magnetic field produced by conducting A.C. current through the geological formation between two electrodes which are in electrical contact with the surface of the earth, and (b) applying said A.C. magnetic field to a remote subterranean oil bearing formation at frequencies near and including the Larmor frequency of the nucleons in any oil and water present in said subterranean oil bearing formation which is at an angle with respect to the earth's magnetic field to bring a portion of the oil reserves into a state of nuclear magnetic resonance to reduce the nuclear paramagnetism of said portion of the petroleum reserves, and (c) simultaneously detecting any change in the total magnetic field of the earth with at least one magnetic sensor located on the surface of the earth whereby to indicate the presence or absence and the extent of the petroleum reserves located in said remote subterranean oil bearing formation.

* * * * *